United States Patent
Funabashi

(10) Patent No.: US 10,948,829 B2
(45) Date of Patent: Mar. 16, 2021

(54) PATTERN FORMING APPARATUS, ALIGNMENT MARK DETECTION METHOD, AND PATTERN FORMING METHOD

(71) Applicant: CANON KABUSHIKI KAISHA, Tokyo (JP)

(72) Inventor: Naoki Funabashi, Utsunomiya (JP)

(73) Assignee: CANON KABUSHIKI KAISHA, Tokyo (JP)

(*) Notice: Subject to any disclaimer, the term of this patent is extended or adjusted under 35 U.S.C. 154(b) by 0 days.

(21) Appl. No.: 16/284,751

(22) Filed: Feb. 25, 2019

(65) Prior Publication Data

US 2019/0265595 A1  Aug. 29, 2019

(30) Foreign Application Priority Data

Feb. 28, 2018 (JP) .............................. JP2018-035313

(51) Int. Cl.
*G03F 7/20* (2006.01)
*G03F 9/00* (2006.01)

(52) U.S. Cl.
CPC ...... *G03F 7/70191* (2013.01); *G03F 7/70141* (2013.01); *G03F 9/7084* (2013.01); *G03F 9/7088* (2013.01)

(58) Field of Classification Search
CPC ............. G03F 7/70141; G03F 7/70191; G03F 9/7084; G03F 9/7088
See application file for complete search history.

(56) References Cited

U.S. PATENT DOCUMENTS

| | | | | |
|---|---|---|---|---|
| 5,872,618 A * | 2/1999 | Nagayama | ........... | G03F 7/70058 355/53 |
| 6,456,377 B1 * | 9/2002 | Suzuki | ............... | G03F 7/70066 356/399 |
| 6,525,805 B2 * | 2/2003 | Heinle | ................... | G03B 27/42 355/53 |
| 7,113,258 B2 * | 9/2006 | Van Buel | ............ | G03F 7/70341 355/53 |
| 7,292,339 B2 * | 11/2007 | Lof | ........................ | G03F 9/7003 356/401 |
| 7,463,337 B2 * | 12/2008 | Van Buel | ............ | G03F 7/70716 355/72 |
| 7,751,047 B2 * | 7/2010 | Bijnen | .................. | H01L 23/544 356/401 |
| 7,751,067 B1 * | 7/2010 | True | ...................... | G03F 9/7084 356/614 |
| 8,294,875 B2 * | 10/2012 | Ohsaki | ................... | G03B 27/32 355/52 |
| 8,659,743 B2 * | 2/2014 | Mishima | ............. | G03F 7/70633 355/53 |

(Continued)

FOREIGN PATENT DOCUMENTS

EP 3258319 A2 12/2017
JP 2002-280299 A 9/2002

*Primary Examiner* — Deoram Persaud
(74) *Attorney, Agent, or Firm* — Canon U.S.A., Inc. IP Division

(57) ABSTRACT

A pattern forming apparatus configured to form a pattern on a substrate includes a holding portion configured to hold the substrate by suction, an optical system configured to detect, from a suction surface side of the substrate, an alignment mark provided to the substrate held by the holding portion, and a unit configured to shield light entering the optical system.

25 Claims, 15 Drawing Sheets

(56) References Cited

U.S. PATENT DOCUMENTS

| | | | | |
|---|---|---|---|---|
| 9,188,434 B2* | 11/2015 | Xu | .......................... | G01B 11/26 |
| 2001/0043321 A1* | 11/2001 | Nishi | ................... | G03F 7/70058 |
| | | | | 355/67 |
| 2002/0041377 A1* | 4/2002 | Hagiwara | ................ | G03F 7/707 |
| | | | | 356/399 |
| 2002/0081778 A1* | 6/2002 | Inoue | .................. | H01L 23/3735 |
| | | | | 438/122 |
| 2002/0109825 A1* | 8/2002 | Gui | ..................... | G03F 7/70691 |
| | | | | 355/53 |
| 2006/0119821 A1* | 6/2006 | Ando | ....................... | G03F 7/706 |
| | | | | 355/55 |
| 2006/0221316 A1* | 10/2006 | Yamamoto | .............. | G03F 7/706 |
| | | | | 355/53 |
| 2009/0128792 A1 | 5/2009 | Pellens | | |
| 2009/0207399 A1 | 8/2009 | Fong | | |
| 2013/0258095 A1* | 10/2013 | Nishida | ............... | G03F 7/70133 |
| | | | | 348/95 |
| 2016/0363875 A1* | 12/2016 | Shinoda | ................. | G03F 7/0002 |
| 2017/0351173 A1* | 12/2017 | Funabashi | ............. | G03F 9/7084 |
| 2019/0278186 A1* | 9/2019 | Fujishima | ............. | G03F 9/7084 |

* cited by examiner

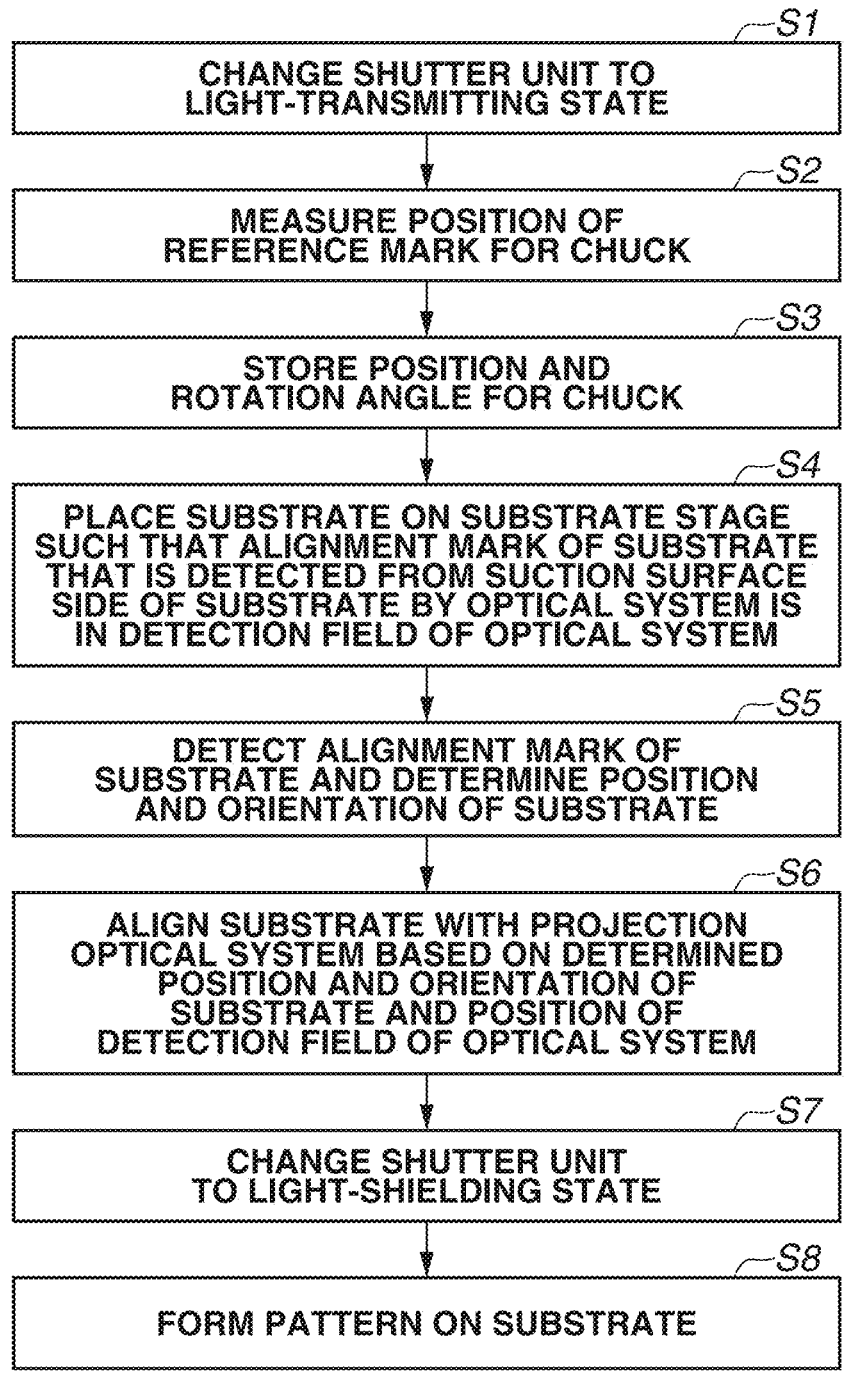

PATTERN FORMING APPARATUS, ALIGNMENT MARK DETECTION METHOD, AND PATTERN FORMING METHOD

BACKGROUND OF THE INVENTION

Field of the Invention

The present invention relates to a pattern forming apparatus, an alignment mark detection method, and a pattern forming method.

Description of the Related Art

In manufacturing a device such as a semiconductor device or a liquid crystal display device using photolithography technology, an exposure apparatus is used to project a mask pattern from a projection optical system and the pattern is transferred onto a substrate.

In recent years, an exposure apparatus has been used to manufacture not only an integrated circuit (IC) chip such as a memory or a logic chip but also a stacked device using a through-via process, e.g. a device such as a microelectromechanical system (MEMS) or complementary metal oxide semiconductor (CMOS) image sensor. In the manufacture of such a device, although both linewidth resolution and overlay precision are not highly required, a deeper depth of focus than that in the conventional manufacture of an IC chip is required.

Further, an exposure apparatus performs an exposure process in which the front surface side of a substrate such as a silicon wafer is exposed based on an alignment mark formed on the rear surface side of the substrate, i.e., the side of the surface which is suctioned by a chuck. The exposure process is necessary to form a through-via from the front surface side of the substrate for an electrical connection to a circuit on the rear surface side. Thus, detection (hereinafter, "rear surface alignment") of an alignment mark formed on the rear surface side of a substrate is needed. Especially, in order to conduct the exposure process in which the front surface side of a substrate is exposed based on an alignment mark formed on the rear surface side of the substrate, overlay inspection of an alignment mark formed on the front surface side of the substrate and an alignment mark formed on the rear surface side of the substrate is needed.

Japanese Patent Application Laid-Open No. 2002-280299 discusses a lithography apparatus in which an optical system for alignment mark detection is disposed on the rear surface side of a substrate in order to conduct rear surface alignment. Further, Japanese Patent Application Laid-Open No. 2002-280299 discusses a technique in which a mark is observed from a substrate stage side using an optical system which is provided to the substrate stage to detect an alignment mark, and an image of the mark is detected.

In the case in which the optical system for detecting an alignment mark is disposed on the substrate stage as discussed in Japanese Patent Application Laid-Open No. 2002-280299, exposure light for exposing a substrate may enter the optical system for detecting an alignment mark, depending on the detection field position of the optical system.

In this case, if the exposure light illuminates an optical member of the optical system for detecting an alignment mark, a change in optical characteristics due to coloring of the optical member or a decrease in transmission rate may occur. If a change in optical characteristics of the optical system for detecting an alignment mark occurs, the time needed for alignment control using an alignment mark may increase, whereby productivity in device manufacture is decreased. Further, a decrease in alignment accuracy may occur as a result of a decrease in alignment mark detection accuracy.

SUMMARY OF THE INVENTION

According to an aspect of the present invention, a pattern forming apparatus configured to form a pattern on a substrate includes a holding portion configured to hold the substrate by suction, an optical system configured to detect, from a suction surface side of the substrate, an alignment mark provided to the substrate held by the holding portion, and a unit configured to shield light entering the optical system.

Further features of the present invention will become apparent from the following description of exemplary embodiments with reference to the attached drawings. Each of the embodiments of the present invention described below can be implemented solely or as a combination of a plurality of the embodiments. Also, features from different embodiments can be combined where necessary or where the combination of elements or features from individual embodiments in a single embodiment is beneficial.

BRIEF DESCRIPTION OF THE DRAWINGS

FIG. 9 is a flowchart illustrating a process from a substrate alignment operation to an exposure operation in accordance with the present invention.

DESCRIPTION OF THE EMBODIMENTS

Various exemplary embodiments of the present invention will be described below with reference to the attached drawings along with an explanation of the operation of a standard mask pattern formation apparatus.

Figure 1:
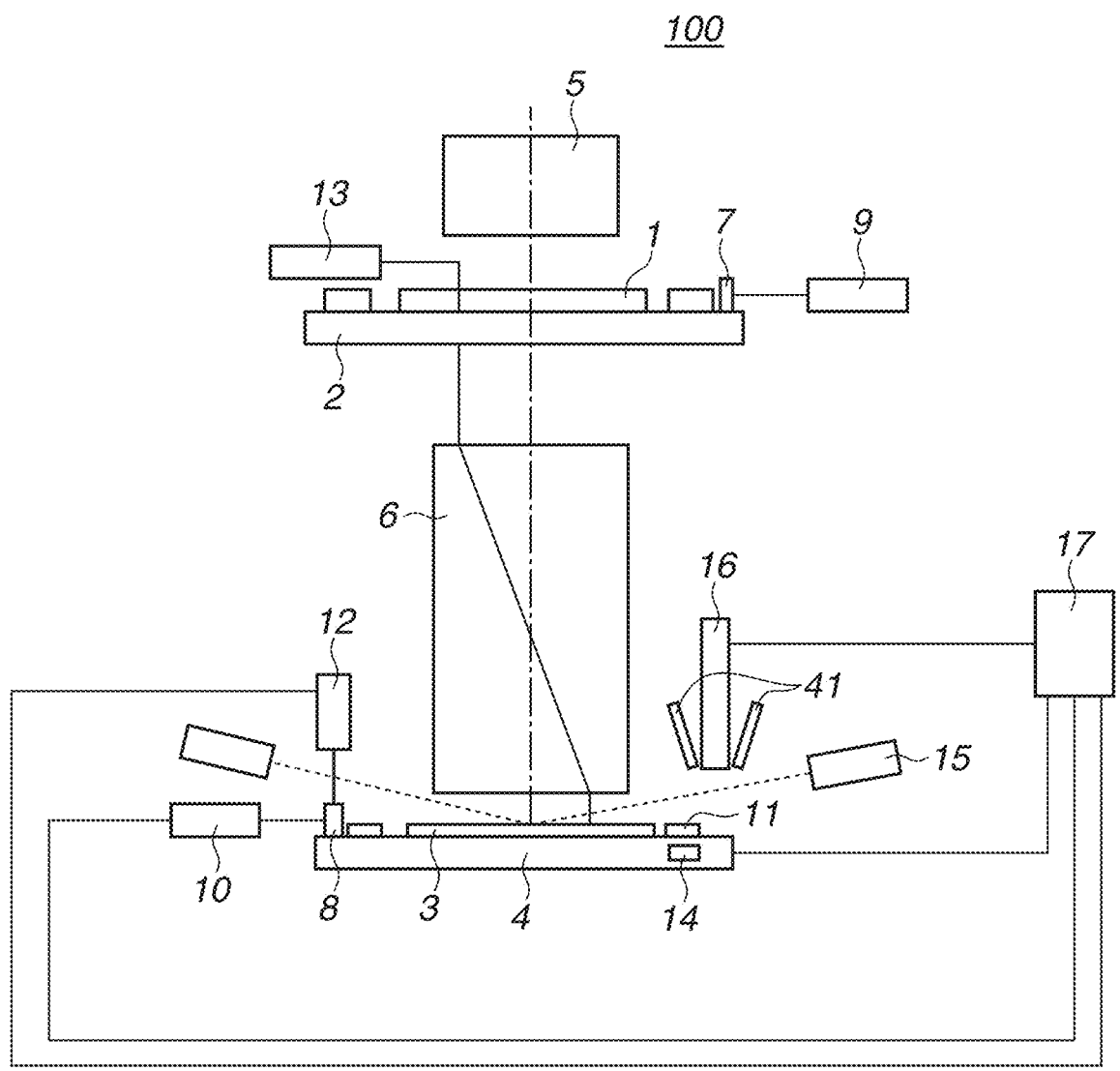
FIG. 1 is a diagram schematically illustrating an exposure apparatus.

FIG. 1 is a schematic view illustrating the configuration of an exposure apparatus 100 according to an aspect of an exemplary embodiment of the present invention. The exposure apparatus 100 is an example of a lithography apparatus (pattern forming apparatus) configured to form a pattern on a substrate. The exposure apparatus 100 includes a mask stage 2, a substrate stage 4, and an illumination optical system 5. The mask stage 2 holds a mask (reticle) 1. The substrate stage 4 holds a substrate 3. The illumination optical system 5 illuminates the mask 1 held on the mask stage 2. Further, the exposure apparatus 100 includes a projection optical system 6 and a control unit (computer) 17. The projection optical system 6 projects a pattern image of the mask 1 onto the substrate 3 held on the substrate stage 4. The control unit 17 comprehensively controls the entire operations of the exposure apparatus 100.

In the present exemplary embodiment, the exposure apparatus 100 is a scan-type exposure apparatus (scanner) configured to transfer the pattern of the mask 1 onto the substrate 3 while the mask 1 and the substrate 3 are scanned in synchronization with each other in a scan direction (i.e., in a step-and-scan method). Alternatively, the exposure apparatus 100 can be an exposure apparatus (stepper) configured to project the pattern of the mask 1 onto the substrate 3 in a state in which the mask 1 is fixed (i.e., in a step-and-repeat method).

Hereinafter, the direction (optical axis direction) that corresponds to the optical axis of the projection optical system 6 will be referred to as "Z-axis direction", the scan direction of the mask 1 and the substrate 3 in a plane that is perpendicular to the Z-axis direction will be referred to as "Y-axis direction", and the direction (non-scan direction) that is perpendicular to the Z-axis and Y-axis directions will be referred to as "X-axis direction". Further, rotation directions about the X-axis, the Y-axis, and the Z-axis will be referred to as a "θX-direction", a "θY-direction", and a "θZ-direction", respectively.

The illumination optical system 5 illuminates the mask 1, specifically a predetermined illumination region on the mask 1, with light (exposure light) having a uniform illuminance distribution. Examples of exposure light include g-line (wavelength about 436 nm) and i-line (wavelength about 365 nm) of an ultra-high pressure mercury lamp, KrF excimer laser (wavelength about 248 nm), ArF excimer laser (wavelength about 143 nm), and F2 laser (wavelength about 157 nm). Further, in order to manufacture a more precise semiconductor device, extreme ultraviolet light (EUV light) of several nanometers to several hundred nanometers can be used as exposure light.

The mask stage 2 is configured in such a manner that the mask stage 2 is two-dimensionally movable in the plane that is perpendicular to the optical axis of the projection optical system 6, i.e., in the XY-plane, and rotatable in the θZ-direction. The mask stage 2 is one- or six-axis driven by a driving apparatus (not illustrated) such as a linear motor.

On the mask stage 2, a mirror 7 is disposed. Further, a laser interferometer 9 is disposed at a position facing the mirror 7. The two-dimensional position and rotation angle of the mask stage 2 are measured in real time by the laser interferometer 9, and the measurement results are output to the control unit 17. The control unit 17 controls the driving apparatus of the mask stage 2 based on the measurement results of the laser interferometer 9 and positions the mask 1 held on the mask stage 2.

The projection optical system 6 includes a plurality of optical elements and projects the pattern of the mask 1 onto the substrate 3 at a predetermined projection magnification β. A photoresist (resist) is applied in advance to the substrate 3, and when an image of the pattern of the mask 1 is projected onto the photoresist, a latent image pattern is formed on the photoresist. The projection optical system 6 according to the present exemplary embodiment is a reduction optical system having a projection magnification β of, for example, ¼ or ⅕.

The substrate stage 4 includes a Z-stage, an XY-stage, and a base. The Z-stage holds the substrate 3 via a chuck configured to suction-hold the substrate 3. The XY-stage supports the Z-stage, and the base supports the XY-stage. The substrate stage 4 is driven by the driving apparatus such as a linear motor. The chuck configured to suction-hold the substrate 3 is removably attached to the substrate stage 4.

On the substrate stage 4, a mirror 8 is disposed. Further, laser interferometers 10 and 12 are disposed at positions facing the mirror 8. The position of the substrate stage 4 in the X-axis and Y-axis directions and the θZ-directions is measured in real time by the laser interferometer 10, and the measurement results are output to the control unit 17. Similarly, the position of the substrate stage 4 in the Z-axis direction and the θX- and θY-directions is measured in real time by the laser interferometer 12, and the measurement results are output to the control unit 17. The control unit 17 controls the driving apparatus of the substrate stage 4 based on the measurement results of the laser interferometers 10 and 12 and positions the substrate 3 held on the substrate stage 4.

A mask alignment detection system 13 is disposed near the mask stage 2. The mask alignment detection system 13 detects, via the projection optical system 6, a mask reference mark (not illustrated) on the mask 1 held on the mask stage 2 and a reference mark 39 on a stage reference plate 11 disposed on the substrate stage 4.

The mask alignment detection system 13 illuminates the mask reference mark on the mask 1 and the reference mark 39 via the projection optical system 6 using the light source that is used to expose the substrate 3. Further, the mask alignment detection system 13 detects reflection light from the mask reference mark and the reference mark 39 using an image sensor (e.g., photoelectric conversion element such as charge-coupled device (CCD) camera). The mask 1 and the substrate 3 are aligned based on the detection signal from the image sensor. In the alignment, the relative positional relationship (X, Y, Z) between the mask 1 and the substrate 3 can be adjusted by aligning and focusing the positions of the mask reference mark on the mask 1 and the reference mark 39 on the stage reference plate 11.

A mask alignment detection system 14 is disposed on the substrate stage 4. The mask alignment detection system 14 is a transmission-type detection system and is used in a case in which the reference mark 39 is a transmission-type mark. The mask alignment detection system 14 illuminates the mask reference mark on the mask 1 and the reference mark 39 using the light source that is used to expose the substrate 3, and detects transmission light from the marks using a light-quantity sensor. In this detection, while the substrate stage 4 is moved in the X-axis direction (or Y-axis direction) and the Z-axis direction, the mask alignment detection system 14 detects the light quantity of the transmission light having transmitted through the reference marks. In this way, the positions of the mask reference mark on the mask 1 and the reference mark 39 on the stage reference plate 11 can be aligned and focused. Accordingly, the relative positional relationship (X, Y, Z) between the mask 1 and the substrate 3 is adjustable using either one of the mask alignment detection system 13 and the mask alignment detection system 14.

The stage reference plate 11 is disposed at a corner of the substrate stage 4 in such a manner that the height of the front surface of the stage reference plate 11 is substantially the same as the height of the front surface of the substrate 3. The stage reference plate 11 can be disposed either at one corner of the substrate stage 4 or a plurality of corners of the substrate stage 4.

Figure 2:
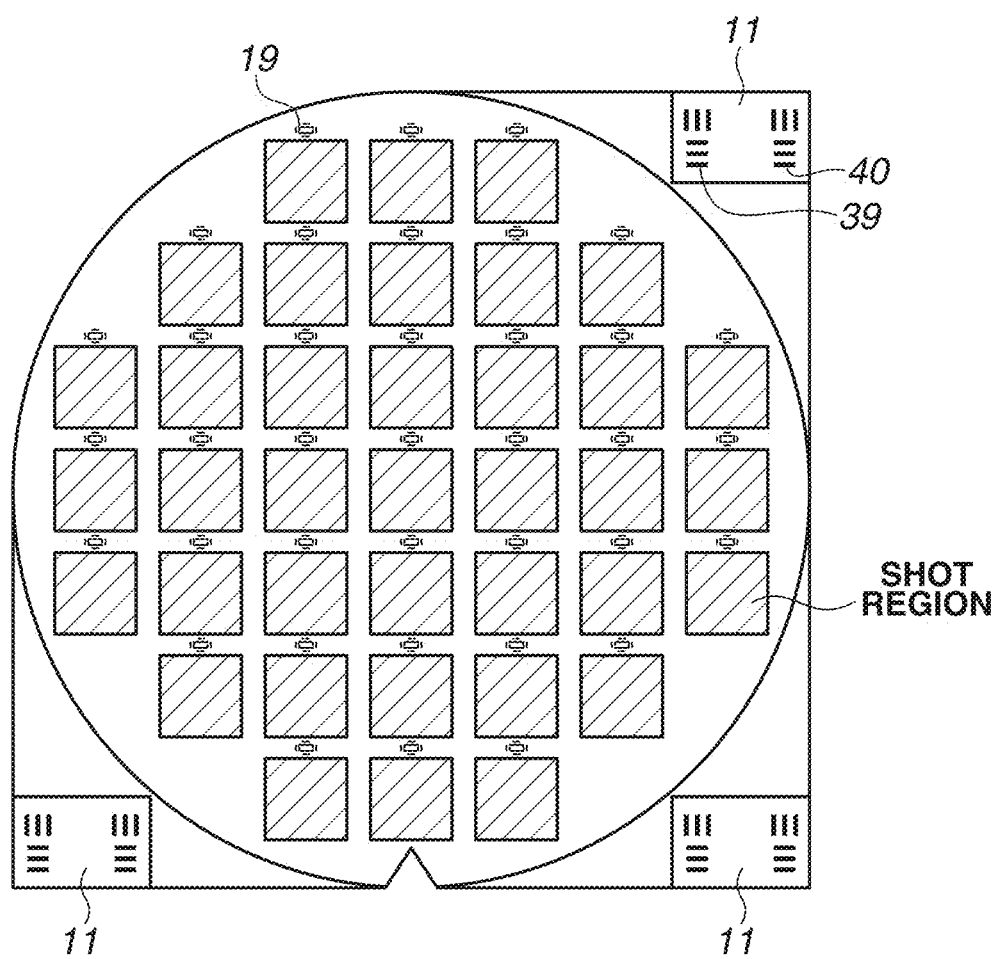
FIG. 2 is a plan view illustrating a substrate and a substrate stage.

As illustrated in FIG. 2, the stage reference plate 11 includes the reference mark 39, which is to be detected by the mask alignment detection system 13 or 14, and a reference mark 40, which is to be detected by a substrate alignment detection system 16. FIG. 2 is a plan view illustrating a wafer (substrate) 3 and the wafer stage (substrate stage) 4 viewed from the Z-direction. The stage reference plate 11 can include a plurality of reference marks 39 and/or a plurality of reference marks 40. Further, the positional relationship (X-axis and Y-axis directions) between the reference marks 39 and 40 is set to a predetermined positional relationship (i.e., known). The reference marks 39 and 40 can be a shared mark. As illustrated in FIG. 2, a mark for alignment is formed in each scribe line between shot regions of the wafer 3.

A focus detection system 15 includes a projection system and a light reception system. The projection system projects light onto the front surface of the substrate 3, and the light reception system receives light reflected on the front surface of the substrate 3. The focus detection system 15 detects the position of the substrate 3 in the Z-axis direction and outputs the detection result to the control unit 17. The control unit 17 controls the driving apparatus that drives the substrate stage 4 based on the detection result of the focus detection system 15, and adjusts the position of the substrate 3 held on the substrate stage 4 in the Z-axis direction and the inclination angle.

The substrate alignment detection system 16 includes an optical system such as an illumination system configured to illuminate the marks and an image forming system configured to form images of the marks based on the light from the marks. The substrate alignment detection system 16 detects various marks, e.g., an alignment mark formed on the substrate 3 and the reference mark 40 on the stage reference plate 11 and outputs the detection results to the control unit 17. The control unit 17 controls the driving apparatus that drives the substrate stage 4 based on the detection results of the substrate alignment detection system 16, and adjusts the position of the substrate 3 held on the substrate stage 4 in the X-axis and Y-axis directions or the rotation angle in the θZ-direction.

Further, the substrate alignment detection system 16 includes a focus detection system (AF detection system) 41 for the substrate alignment detection system 16. Similar to the focus detection system 15, the AF detection system 41 includes a projection system configured to project light onto the front surface of the substrate 3 and a light reception system configured to receive light reflected on the front surface of the substrate 3. The focus detection system 15 is used to adjust the focus of the projection optical system 6, whereas the AF detection system 41 is used to adjust the focus of the substrate alignment detection system 16.

In general, the configuration of the detection system for detecting the marks on the substrate side is divided roughly into two, an off-axis alignment (OA) detection system and a through-the-lens alignment (TTL) detection system. The OA detection system optically detects an alignment mark formed on the substrate 3 not via a projection optical system. The TTL detection system detects an alignment mark formed on a substrate via a projection optical system using light (non-exposure light) having a different wavelength from the wavelength of exposure light. While the substrate alignment detection system 16 is an OA detection system according to the present exemplary embodiment, the alignment detection method is not limited to the system according to the present exemplary embodiment. For example, in a case in which the substrate alignment detection system 16 is a TTL detection system, the substrate alignment detection system 16 detects the alignment mark formed on the substrate 3 via the projection optical system 6. The basic configuration of the system in such a case is however similar to the configuration of the OA detection system.

Figure 3:
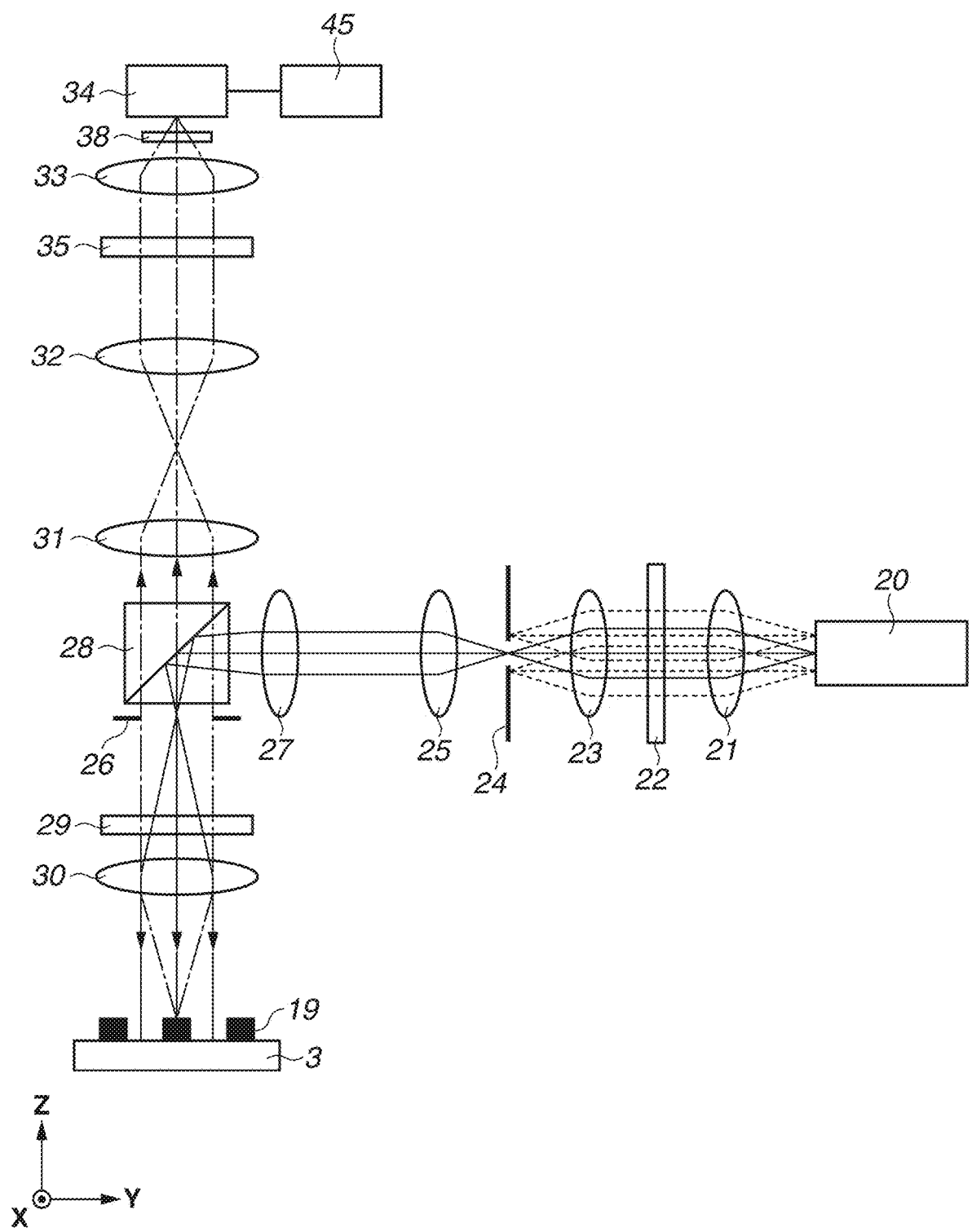
FIG. 3 is a schematic view illustrating a substrate alignment detection system.

The following describes the substrate alignment detection system 16 with reference to FIG. 3. FIG. 3 is a schematic view illustrating the specific configuration of the substrate alignment detection system 16. The substrate alignment detection system 16 functions as a detection unit configured to detect various marks. For example, the substrate alignment detection system 16 detects an alignment mark (first mark) formed on the front surface (first surface) of the substrate 3 and also detects an alignment mark (second mark) formed on the rear surface (second surface opposite to the first surface) of the substrate 3. The rear surface of the substrate 3 is the substrate surface of a side that is suctioned by the chuck configured to suction-hold the substrate 3, and the front surface of the substrate 3 is the substrate surface of a side that is on the opposite side to the suction surface and to which the photoresist for pattern forming is applied. Further, as described below, the substrate alignment detection system 16 detects a reference mark formed on the chuck. For simplified description, the description will be given of an example a case in which the substrate alignment detection system 16 detects an alignment mark (hereinafter, "front-surface-side mark") 19 formed on the front surface side of the substrate 3 illustrated in FIG. 2 with reference to FIG. 3. According to the present exemplary embodiment, the substrate 3 is a silicon (Si) wafer.

A light source 20 emits visible light (e.g., light having a wavelength of 400 nm to 800 nm) as light having a wavelength that does not pass through the substrate 3, and infrared light (e.g., light having a wavelength of 800 nm to 1500 nm) as light having a wavelength that passes through the substrate 3. The light from the light source 20 passes through a first relay optical system 21, a wavelength filter plate 22, and a second relay optical system 23 and reaches an aperture stop 24 disposed at the pupil plane (optical Fourier-transformation plane with respect to object plane) of the substrate alignment detection system 16.

The wavelength filter plate 22 is provided with a plurality of filters each configured to transmit a light ray of a different wavelength band, and one of the plurality of filters is selected and disposed on the optical path of the substrate alignment detection system 16 under the control by the control unit 17. According to the present exemplary embodiment, the wavelength filter plate 22 is provided with a visible light filter that transmits visible light and an infrared light filter that transmits infrared light, and the filters are switched to illuminate a mark with one of a visible light and an infrared light. The wavelength filter plate 22 is configured in such a manner that a new filter can be added to the wavelength filter plate 22.

A plurality of aperture stops each having illuminations σ (aperture diameters) different from each other is provided as the aperture stop 24, and the illumination σ of the light to illuminate the mark is changeable by switching the aperture stop to be disposed on the optical path of the substrate alignment detection system 16 under the control by the control unit 17. The aperture stop 24 is configured in such a manner that a new aperture stop can be added to the aperture stop 24.

The light having reached the aperture stop 24 is guided to a polarization beam splitter 28 via a first illumination system 25 and a second illumination system 27. Among the light guided to the polarization beam splitter 28, S-polarized light perpendicular to the sheet surface is reflected at the polarization beam splitter 28 and transmitted through a numerical aperture (NA) stop 26 and a λ/4 plate 29 to change into circular-polarized light. The light transmitted through the λ/4 plate 29 passes through an objective lens 30 and illuminates the front-surface-side mark 19 formed on the substrate 3. The numerical aperture of the NA stop 26 is changeable by changing the aperture amount under the control by the control unit 17.

The reflection light, diffraction light, and scattered light from the front-surface-side mark 19 passed through the objective lens 30 are changed to P-polarized light parallel to the sheet surface by passing through the λ/4 plate 29, and pass through the polarization beam splitter 28 via the NA stop 26. The light passed through the polarization beam splitter 28 forms an image of the front-surface-side mark 19 on a photoelectric conversion element (e.g., sensor such as CCD sensor) 34 via a relay lens 31, a first image forming system 32, a comatic aberration adjustment optical member 35, and a second image forming system 33. The photoelectric conversion element 34 captures (detects) the image of the front-surface-side mark 19 and acquires a detection signal. In a case in which an image of the alignment mark formed on the rear surface of the substrate 3 is formed on the photoelectric conversion element 34, the photoelectric conversion element 34 captures the image of the alignment mark and acquires a detection signal.

In the case in which the substrate alignment detection system 16 detects the front-surface-side mark 19 formed on the substrate 3, monochromatic light or light of a narrow wavelength band produces an interference fringe since the resist (transparent layer) is applied (formed) on the front-surface-side mark 19. Consequently, a signal of the interference fringe is added to the detection signal from the photoelectric conversion element 34, and it thus becomes difficult to detect the front-surface-side mark 19 with great accuracy. Thus, in general, a light source configured to emit light of a wide wavelength band is used as the light source 20 to thereby prevent an interference fringe signal from being added to the detection signal from the photoelectric conversion element 34.

A processing unit 45 performs processing to determine the position of the mark based on the image of the mark that is captured by the photoelectric conversion element 34. Alternatively, the function of the processing unit 45 can be included in the control unit 17 or an external control apparatus.

First Exemplary Embodiment

While the substrate alignment mark detection method in which a mark is detected by illuminating from the front surface side of a substrate is described above as an example. According to the present exemplary embodiment, the description will be given of an example in which a mark is detected by illuminating from the rear surface side of a substrate.

Figure 4:
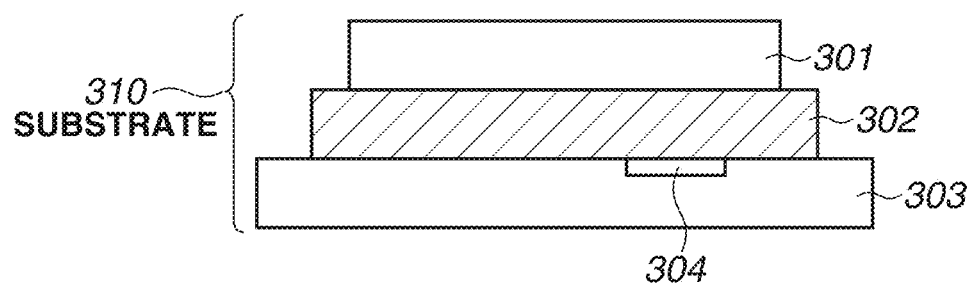
FIG. 4 is a cross-sectional view illustrating a substrate.

The description will be given of a substrate on which an alignment mark to be detected is formed. According to the present exemplary embodiment, an alignment mark is formed in a substrate 310 having a layered structure as illustrated in FIG. 4. FIG. 4 is a schematic cross-sectional view illustrating the substrate 310. In the substrate 310, an intermediate layer 302, such as a metal layer or highly-doped layer, is formed between a first wafer 301 and a second wafer 303. The intermediate layer 302 is made of a material that is less likely to transmit infrared light. On the second wafer 303, an alignment mark 304 is formed, and the lower surface of the second wafer 303 is to be suctioned by the chuck. The alignment mark 304 on the second wafer 303 is used for the process for aligning the substrate 310 based on the detected position of the alignment mark 304 and forming a pattern on the first wafer 301.

Since the intermediate layer 302 is less likely to transmit infrared light, it is difficult to detect the alignment mark 304 from the first wafer 301 side using infrared light. Thus, according to the present exemplary embodiment, the alignment mark 304 is detected from the second wafer 303 side.

Figure 5:
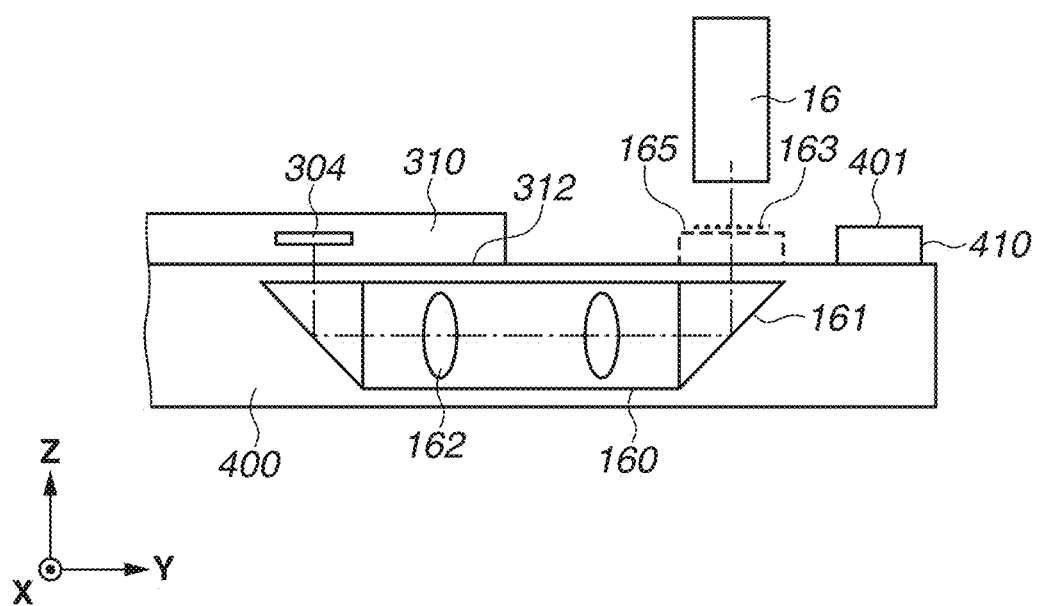
FIG. 5 is a view illustrating an optical system configuration in accordance with the present invention.

FIG. 5 is a diagram illustrating an optical system 160 for detecting the alignment mark 304 from the second wafer 303 side. FIG. 5 is a cross-sectional view illustrating a configuration including the optical system 160. The position of the optical system 160 is fixed in a chuck 400 (holding portion) which suction-holds the substrate 310, and the optical system 160 is integrated with the chuck 400.

The optical system 160 includes a mirror 161, a lens, and a barrel. The mirror 161 reflects illumination light from the substrate alignment detection system 16, and the lens guides the light reflected by the mirror 161 to the substrate 310. The optical system 160 is a relay (image forming) optical system which illuminates the alignment mark 304 on the substrate 310 using the illumination light from the substrate alignment detection system 16 and forms an image of the alignment mark 304 on an image plane 163 which is disposed separately from the substrate 310.

The substrate alignment detection system 16 detects the image of the alignment mark 304 that is formed on the image plane 163, and determines the position of the alignment mark 304. The height of the image plane 163 in the Z-direction is changeable as desired in design. Thus, the range of the height of the image plane 163 which varies depending on the substrate (wafer) thickness and mark position is settable to fall within the driving range of the substrate stage 4 in the Z-direction.

The illumination light source and the photoelectric conversion element are provided to the substrate alignment detection system 16 and the optical system 160 includes the relay optical system, whereby a thermal deformation of the chuck 400 is prevented and the weight is reduced. It is desirable that the wavelength of the illumination light is set to a wavelength of infrared light that is transmitted through silicon, e.g., 1000 nm or more.

If the position of the alignment mark 304 on the substrate 310 is changed, i.e., if the distance from a suction surface 312 of the substrate 310 which is suctioned by the chuck 400 to the alignment mark 304 is changed, the position of the image plane 163 changes. Thus, the substrate stage 4 is moved in the Z-direction based on the distance from the suction surface 312 to the alignment mark 304 in such a manner that the image plane 163 is within the depth of focus that is detectable by the substrate alignment detection system 16.

According to the present exemplary embodiment, with consideration given to the mark position measurement accuracy and the size of the optical system, the detection (observation) field of the optical system 160 is about φ1 mm and the magnification of the optical system 160 is one. The position measurement accuracy is about 500 nm. For example, in a case in which the optical system 160 is a magnification reduction system, while the observation field increases, the measurement accuracy deteriorates. Further, in a case in which the lens diameter of the optical system 160 is further increased, while the observation field increases, there is a restriction on the space in the chuck 400.

Further, a shutter unit 165 is provided in the optical path of the illumination light from the substrate alignment detection system 16. The shutter unit 165 is movable in the XY-plane, and a movement in the XY-plane causes a change in the light transmission state. While the specific configuration of the shutter unit 165 will be described below, the shutter unit 165 is in one of the light-shielding state and the light-transmitting state. Specifically, the shutter unit 165 has the function of selectively shielding the light emitted toward the shutter unit 165.

When the shutter unit 165 is in the light-transmitting state, light from the above in FIG. 5 enters the optical system 160, whereas when the shutter unit 165 is in the light-shielding state, the light from the above in FIG. 5 is shielded by the shutter unit 165.

For example, while the substrate alignment detection system 16 emits illumination light to detect the alignment mark 304, the shutter unit 165 is set to the light-transmitting state. Further, while a pattern of a mask is projected onto the substrate 310 to form the pattern, the shutter unit 165 is set to the light-shielding state to thereby reduce the risk that unnecessary light enters the optical system 160.

As described above, currently, i-line (wavelength about 365 nm), KrF excimer laser (wavelength about 248 nm), ArF excimer laser (wavelength about 143 nm), etc. are used as exposure light. If light of such wavelength regions enters the optical system 160, solarization of the optical members such as the lens and prism included in the optical system 160 possibly occur and/or the transmission rate possibly decrease. Thus, a mechanism for reducing the amount of exposure light that enters the optical system 160 is needed.

As illustrated in FIG. 5, since the distance between the edge of the substrate 310 and the image plane 163 of the alignment mark 304 is relatively short, there is a high possibility that exposure light enters the optical system 160 especially in the process of exposing the edge portion of the substrate 310.

According to the present exemplary embodiment, the shutter unit 165 is disposed in the optical path of the illumination light to thereby reduce the amount of light that enters the optical system 160, such as the exposure light that can change the optical characteristics of the optical members included in the optical system 160.

While the shutter unit 165 is disposed on the substrate stage 4 in FIG. 5, the shutter unit 165 can be disposed inside the optical system 160.

Figure 6:
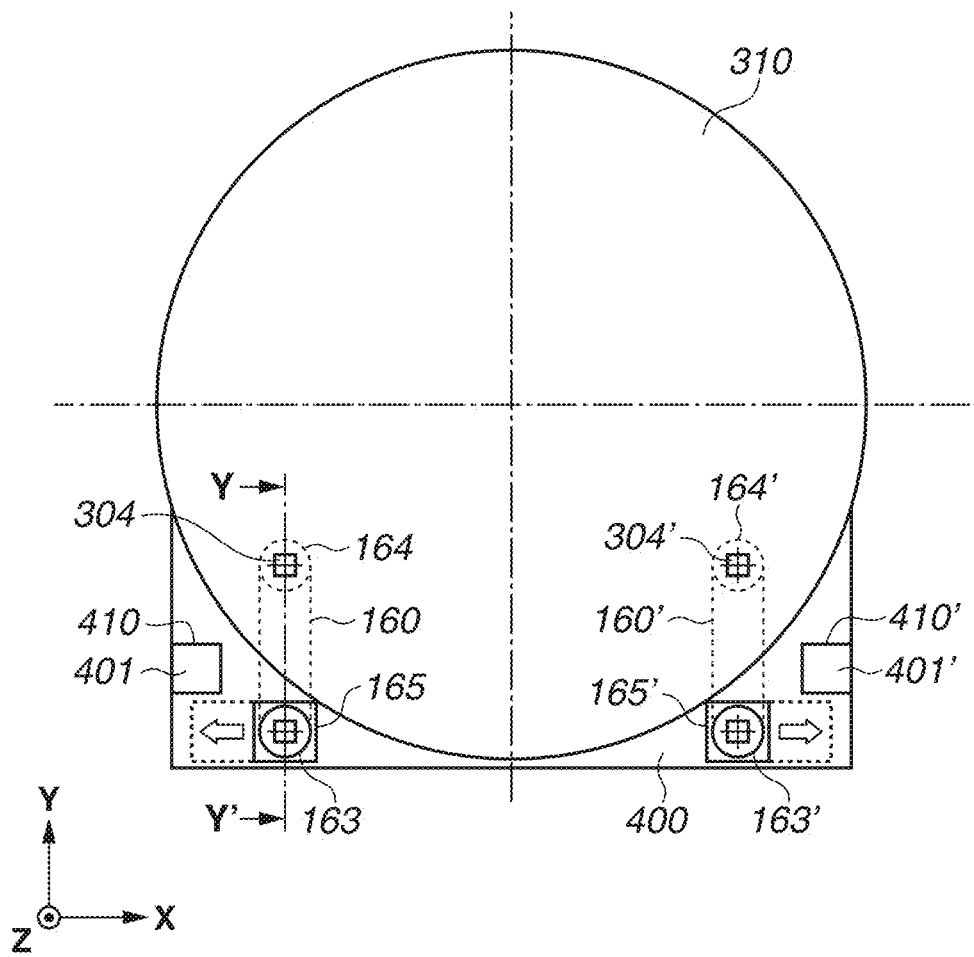
FIG. 6 is a diagram illustrating a substrate and a chuck.

FIG. 6 is a top view illustrating the chuck 400 viewed from the Z-direction. In FIG. 6, the chuck 400 suctions the substrate 310. The chuck 400 is provided with an optical system 160' arranged at a position shifted in the X-direction from the optical system 160, in addition to the optical system 160 specified by a dotted line. The configuration of the optical system 160' is similar to the configuration of the optical system 160.

The optical system 160 illustrated in FIG. 5 is a cross sectional view taken along a cross-section Y-Y' specified in FIG. 6. The optical system 160 illuminates the alignment mark 304 in an observation field (detection field) 164 of the optical system 160 and forms an image of the alignment mark 304 on the image plane 163. Further, the substrate 310 is provided with an alignment mark 304' disposed at a position shifted in the X-direction from a position corresponding to the alignment mark 304, in addition to the alignment mark 304. The optical system 160' illuminates the alignment mark 304' in an the observation field 164' of the optical system 160' and forms an image of the alignment mark 304' on an image plane 163'. In this way, it becomes possible to measure the position of the substrate 310 in the X- and Y-directions and the rotation angle (rotation position) θ about the X-axis with respect to the position of the center of the substrate 310 using the optical systems 160 and 160'.

The observation fields 164 and 164' of the optical systems 160 and 160' are disposed in such a manner that the positions of the observation fields 164 and 164' in the Y-direction are the same in a case in which the chuck 400 is disposed on the substrate stage 4 without a deviation. Since the configurations (optical path lengths) of the optical systems 160 and 160' are set to be the same, the image planes 163 and 163' are disposed in such a manner that the positions of the image planes 163 and 163' in the Y-direction are the same in the case in which the chuck 400 is disposed on the substrate stage 4 without a deviation.

Further, as described with reference to FIG. 5, the shutter units 165 and 165' are provided in the optical path of the illumination light from the substrate alignment detection system 16. In FIG. 6, the shutter units 165 and 165' specified by solid lines are in the light-shielding state. The shutter units 165 and 165' are moved in the direction specified by an arrow to thereby change to the light-transmitting state.

In a shot layout for exposing the substrate 310 (wafer 303), marks suitable for the observation fields 164 and 164' of the optical systems 160 and 160' are needed. The positions of the centers of the observation fields 164 and 164' of the optical systems 160 and 160' are set to (−67.20, −35.50) and (67.20, −35.50) with the center of the substrate 310 at (X, Y)=(0, 0). The image heights in the Y-direction are set to be the same in order to reduce a restriction on the X-direction in the arrangement of the shot layout.

For example, a plurality of marks is provided at 1 mm intervals in alignment at the position Y=−35.50 so that the measurement is always possible in the observation fields 164 and 164' of the optical systems 160 and 160'. Alternatively, coordinates suitable for the fields of the positions (−67.20, −35.50) and (67.20, −35.50) may be specified to dispose the marks. To detect the rotation angle θ about the Z-axis, marks for at least two eyes are necessary. The image heights of the observation fields 164 and 164' can be set on Y=0 or X=0 or can be set to any heights.

The chuck 400 is removably attached to the substrate stage 4. The chuck 400 is replaced with another chuck depending on the substrate to suction or for maintenance. The image height (position in X- and Y-directions) of the observation field 164 of the optical system 160 is fixed with respect to the chuck 400. Thus, the optical system 160 may become no longer capable of detecting the alignment mark 304 if there is a change in the shot layout of the substrate 310 suctioned by the chuck 400 or the position of the alignment mark 304.

In this case, the chuck 400 is removed and replaced with a new chuck that is different from the chuck 400 in the position of the observation field 164 of the optical system 160. Specifically, the chuck 400 is replaced depending on the shot layout of the substrate 310 suctioned by the chuck 400 and/or the position of the alignment mark 304, and the image height of the observation field 164 of the optical system 160 is changed. Further, in a case in which the optical system 160 is contaminated or damaged, the chuck 400 with the optical system 160 as a whole is replaceable with ease.

The exposure apparatus 100 includes a chuck replacement mechanism (not illustrated) for taking in or out the chuck 400. To take out the chuck 400, the suction force of the chuck 400 which is vacuum-suctioned on the substrate stage 4 is turned off, and then the chuck 400 is lifted by the chuck replacement mechanism and moved from the substrate stage 4. To take in the chuck 400, on the other hand, the chuck 400 is moved to a position above the substrate stage 4 by the chuck replacement mechanism, and then positioning holes of the chuck 400 are fitted to two or more positioning pins protruding from the substrate stage 4 to determine the position. Thereafter, the suction force of the chuck 400 is turned on to thereby fix the chuck 400 on the substrate stage 4.

In the replacement process, if the positioning holes of the chuck 400 are large enough to form a gap between the positioning holes and the positioning pins, the positioning pins of the substrate stage 4 are inserted into the positioning holes of the chuck 400 with ease. However, if the gap is excessively large, an error in positioning the chuck 400 on the substrate stage 4 increases and, for example, the chuck 400 is θ-rotated significantly, which causes the position of the observation field 164 of the optical system 160 to deviate from a predetermined position. If the position of the observation field 164 of the optical system 160 is deviated from the predetermined position, it may become difficult to detect the alignment mark 304 of the substrate 310 when the substrate 310 is disposed at the predetermined position on the chuck 400.

Thus, according to the present exemplary embodiment, as illustrated in FIGS. 5 and 6, the reference marks 401 and 401' for measuring the position of the detection field of the optical system 160 are provided and fixed at the predetermined positions on the chuck 400. The reference mark 401 is provided to a mark plate 410 fixed on the chuck 400. Further, the reference mark 401' is provided to a mark plate 410' fixed on the chuck 400. It is desirable that the reference marks 401 and 401' are marks having a two-dimensionally characteristic feature so that the positions in the X- and Y-directions can be measured. For example, a reference mark may have a shape of a two-by-two-matrix and a plus (+) sign, which have a width in both the X and Y directions.

It is desirable that the positions of the reference marks 401 and 401' are provided at the greatest distance possible from the position of the center (intersection point of dot-and-dash lines in FIG. 6) of the chuck 400 (substrate placement region) in order to calculate the rotation angle θ of the chuck 400 with greater accuracy. In an example illustrated in FIG. 6, the reference marks 401 and 401' are disposed near the outermost edges of the chuck 400 in the X-direction. Further, the reference marks 401 and 401' may be disposed in such a manner that the positions of the reference marks 401 and 401' in the Y-direction are the same when the chuck 400 is disposed on the substrate stage 4 without a deviation.

Figure 7:
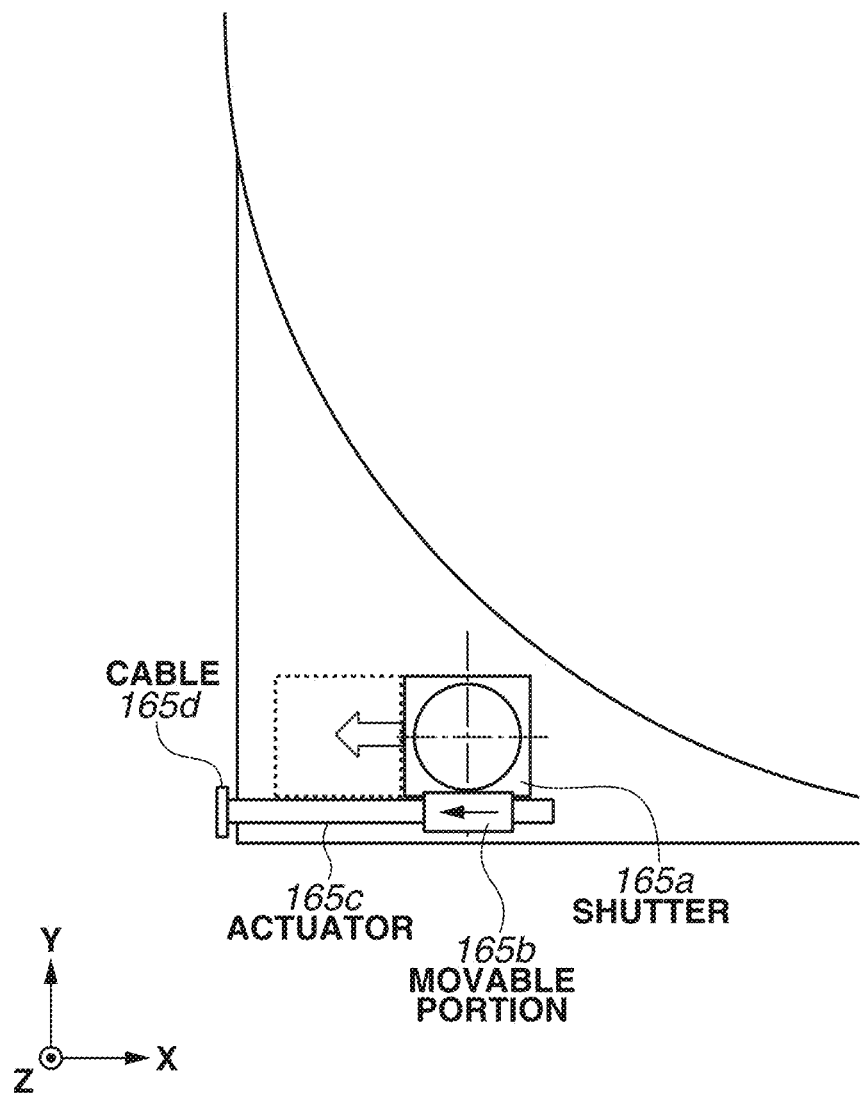
FIG. 7 is a diagram illustrating a shutter unit configuration in accordance with the present invention.

The description will be given of the configuration of the shutter unit 165 with reference to FIG. 7. The shutter unit 165 includes a shutter 165a as a shutter member, a movable portion 165b connected to the shutter 165a, an actuator 165c configured to drive the movable portion 165b, and a cable 165d configured to transmit a driving signal to the actuator 165c.

The actuator 165c drives the movable portion 165b based on the driving signal to thereby move the shutter 165a. The shutter 165a is moved to thereby change the light transmission state of the shutter unit 165 between the light-shielding state and the light-transmitting state. In FIG. 7, when the shutter 165a is in the position specified by a solid line, the shutter unit 165 is in the light-shielding state, and when the shutter 165a is in the position specified by a broken line, the shutter unit 165 is in the light-transmitting state.

As used herein, the term "light-shielding state" refers to the state in which the shutter 165a shields the light that may enter the optical system 160 from the upper surface of the chuck 400. It is desirable to completely shield the light that may enter the optical system 160. It may be possible to allow light to enter the optical system 160 to the extent that a change in optical characteristics of the optical members of the optical system 160 is allowable.

Further, the term "light-transmitting state" refers to the state in which light emitted from the substrate alignment detection system 16 enters the optical system 160 without being shielded by the shutter 165a. As long as the alignment mark 304 provided to the substrate 310 is detectable, the light from the substrate alignment detection system 16 can partially be shielded by the shutter 165a.

The front surface of the shutter 165a is desirably processed so that the processed surface is less likely to reflect light. This reduces the risk that light reflected by the shutter 165a reaches the substrate 310 as a flare. Examples of a processing method for reducing reflection of light include a method in which an anti-reflection film or plating for reducing the reflectance is provided to the front surface of the shutter 165a. Further, a method in which a member capable of absorbing light is provided to the front surface of the shutter 165a can also be used. Various motors such as an ultrasonic motor, linear motor, piezo motor, and stepping motor can be used as the actuator 165c.

Figure 8:
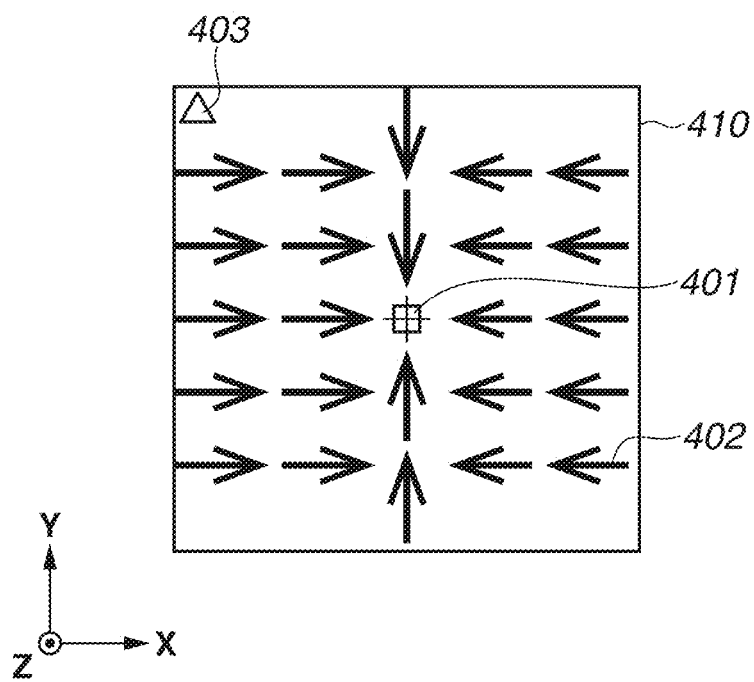
FIG. 8 is a diagram illustrating a reference mark.

FIG. 8 is a diagram illustrating an example of the mark plate 410 to which the reference mark 401 is provided. On the mark plate 410, for example, an arrow mark 402 for searching for the reference mark 401 which indicates the position of the reference mark 401 is formed to facilitate detection of the reference mark 401. The size of the mark plate 410 is, for example, 3 mm in the X-direction and 3 mm in the Y-direction and is set greater than a placement error that can occur at the time of disposing the chuck 400 on the substrate stage 4. Thus, the reference mark 401 is reliably detected even in a case in which the chuck 400 is replaced. Another type of a mark 403 can be provided as an extra mark to prepare for a case in which the reference mark 401 is contaminated or damaged.

The reference mark 401 includes at least two or more marks separated from each other to measure the rotation angle of the entire chuck 400 about the Z-axis with respect to the position of the center of the chuck 400. While the chuck 400 includes the reference marks 401 and 401' each provided on the members at two locations as illustrated in FIG. 6, for example, two marks may be formed on a single member. The reference marks 401 and 401' are detected by the substrate alignment detection system 16.

The substrate alignment detection system 16 moves the substrate stage 4, sequentially detects the reference marks 401 and 401', and measures the position of each of the reference marks 401 and 401'. Then, the position of the chuck 400 is determined based on the relative positions (design value, etc.) of the position of the center of the chuck 400 which is acquired in advance and the reference marks 401 and 401' and the measured positions of the reference marks 401 and 401'. Specifically, the position in the X- and Y-directions as the position of the chuck 400 and the rotation angle θc about the Z-axis with respect to the position of the center of the chuck 400 are determined.

Since the optical systems 160 and 160' are fixed at predetermined positions with respect to the reference marks (chuck 400), the observation fields 164 and 164' of the optical systems 160 and 160' can be determined based on information about the predetermined positions and the measured positions of the reference marks. Specifically, determining the position of the chuck 400 based on the measured positions of the reference marks 401 and 401' is equivalent to determining the positions of the observation fields 164 and 164' of the optical systems 160 and 160'.

The relative positional relationship between the reference marks 401 and 401' and the observation fields 164 and 164' of the optical systems 160 and 160' can be measured in advance, or design values can be used. In the case of measuring the relative positional relationship, for example, a tool substrate that the relative positions of the marks on the chuck-suction surface side (rear surface) and the marks on the opposite side (front surface side) are known is used. The tool substrate is suctioned by the chuck 400, and the marks on the rear surface side are detected using the optical systems 160 and 160', and the positions of the marks on the rear surface side with respect to the positions of the centers of the detection fields of the optical systems 160 and 160' are determined.

Next, the marks on the front surface side are detected using the substrate alignment detection system 16 to determine the positions of the marks on the front surface side. Accordingly, the positions of the centers of the detection fields of the optical systems 160 and 160' in the coordinate system of the substrate stage 4 can be determined based on the determined positions and the relative positions of the marks on the rear surface side and the marks on the front surface side. The positions of the reference marks 401 and 401' are detected using the substrate alignment detection system 16. In this way, the relative positions of the reference marks 401 and 401' and the observation fields 164 and 164' of the optical systems 160 and 160' are measured.

Next, the following describes the relationship between a process in which an exposure operation is conducted after execution of substrate alignment and control of the light transmission state of the shutter unit 165, with reference to the flowchart in FIG. 9. A baseline has been measured as a preliminary apparatus adjustment. Specifically, via the projection optical system 6, the mask alignment detection system 13 detects the reference mark 39 on the stage reference plate 11 disposed on the substrate stage 4. Further, the reference mark 39 on the stage reference plate 11 is detected using the substrate alignment detection system 16. The distance (baseline) between the optical axes of the mask alignment detection system 13 (projection optical system 6) and the substrate alignment detection system 16 is determined based on the two detected positions.

Then, in step S1, the shutter 165a is moved to change the shutter unit 165 to the light-transmitting state. In this way, illumination light from the substrate alignment detection system 16 enters the optical system 160 and the state is changed to the state in which an image of the alignment mark 304 is acquirable.

Then, in step S2, the positions of the reference marks 401 and 401' of the chuck 400 are measured using the substrate alignment detection system 16. Specifically, the substrate alignment detection system 16 detects the reference marks 401 and 401' and measures the positions of the centers of the reference marks 401 and 401'. The positions are measured in the coordinate system of the substrate stage 4. The position of the chuck 400 in the X- and Y-directions and the rotation angle θ about the Z-axis with respect to the position of the center of the chuck 400 can be determined based on the measured positions of the reference marks 401 and 401'.

Then, in step S3, the position of the chuck 400 in the X- and Y-directions and the rotation angle θ about the Z-axis are stored in a memory (storage unit) of the control unit 17. Since the relative positions of the reference marks 401 and 401' and the observation fields 164 and 164' of the optical systems 160 and 160' are known as described above, the positions of the observation fields 164 and 164' of the optical systems 160 and 160' can be determined based on the positions of the reference marks 401 and 401' that are measured in step S2.

Figure 10A:
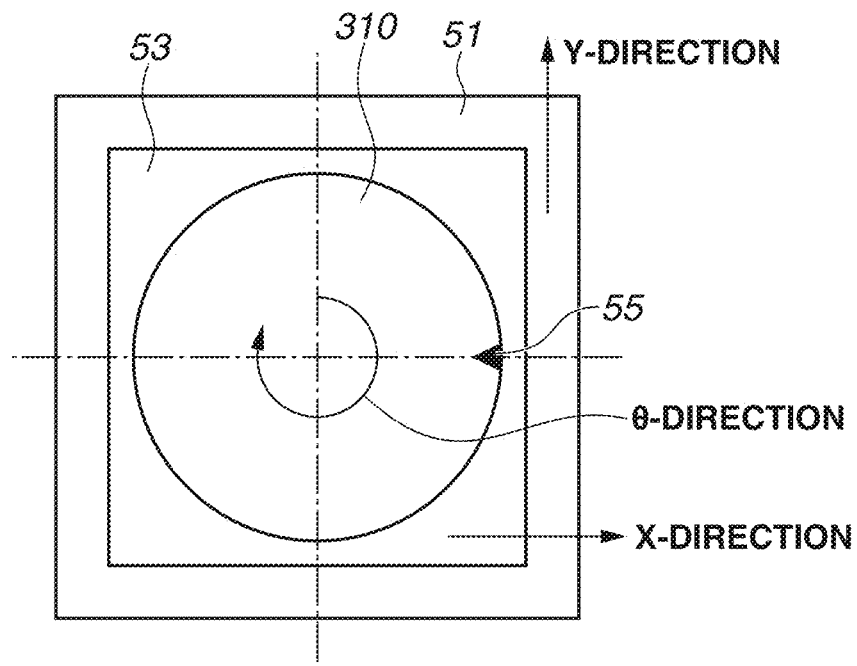
FIGS. 10A and 10B are schematic views illustrating a pre-alignment detector.
Figure 10B:
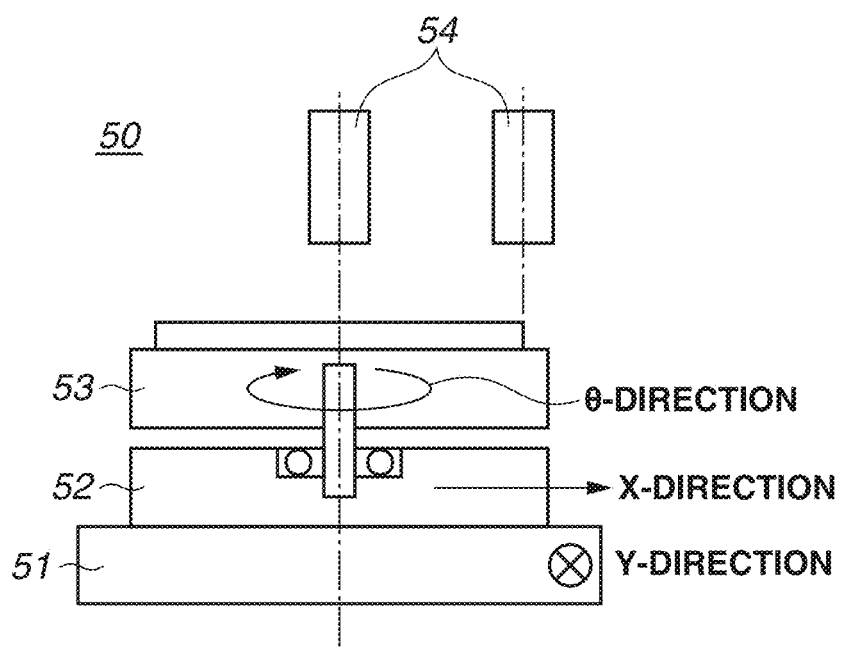

The exposure apparatus 100 includes a pre-alignment (PA) detector 50 (pre-alignment detection unit) configured to hold a substrate and measure the position of the center of the substrate. FIGS. 10A and 10B are diagrams illustrating the PA detector 50. The PA detector 50 includes stages 51, 52, and 53. The stage 51 moves the substrate 310 in the Y-direction. The stage 52 moves the substrate 310 in the X-direction. The stage 53 is capable of rotating and driving the substrate 310 on the XY-plane. Further, the PA detector 50 includes a plurality of cameras 54 (measurement unit) and a processing unit (computer) (not illustrated). The plurality of cameras 54 is capable of detecting the outer surface of the substrate 310 and a notch 55 or orientation flat. The processing unit calculates the position of the substrate 310 based on information detected by the cameras 54.

In the PA detector 50, the position of the center of the substrate 310 in the XY-plane is calculated. Specifically, the PA detector 50 rotates the substrate 310 360 degrees about the Z-axis and observes the shape of the outer surface of the substrate 310 with the cameras 54 in order to detect a positional deviation of the substrate 310. The processing unit calculates an ideal position of the center of the substrate 310 based on the shape of the outer surface of the substrate 310. Further, in the case in which the substrate 310 has the notch 55 or orientation flat, the position of the substrate 310 in the rotation direction is also measurable.

Figure 11:
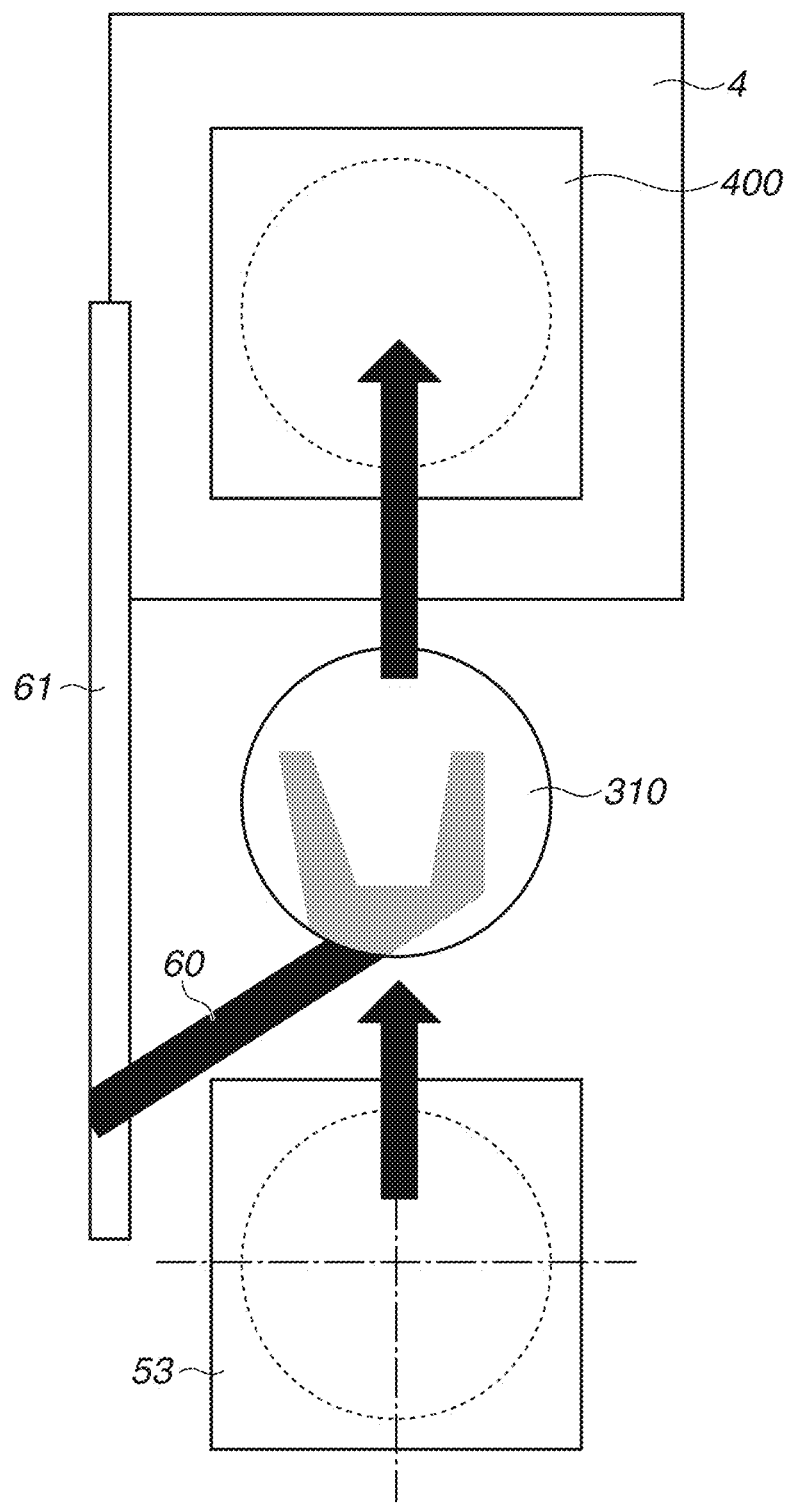
FIG. 11 is a diagram illustrating a conveyance hand configuration.

FIG. 11 illustrates the configuration of a conveyance hand 60 (conveyance unit) configured to convey the substrate 310. At the time of conveying the substrate 310, the conveyance hand 60 is moved under the substrate 310 disposed on the stage 53 of the PA detector 50. In the operation, the suction of the substrate 310 by the stage 53 of the PA detector 50 is weakened in advance, and the conveyance hand 60 lowered in the Z-direction is lifted in the Z-direction to a position at which the conveyance hand 60 is brought into contact with the substrate 310. The conveyance hand 60 also includes a suction mechanism, and after the conveyance hand 60 suctions the substrate 310, the conveyance hand 60 is further lifted in the Z-direction. Thereafter, the conveyance hand 60 can move the substrate 310 to the position of the substrate stage 4 along a guide 61.

In step S4 following step S3, the substrate 310 is disposed on the substrate stage 4 from the PA detector 50 such that the alignment marks 304 and 304' of the substrate 310 detected from the suction surface side of the substrate 310 by the optical systems 160 and 160' are within the detection fields of the optical systems 160 and 160'. The substrate 310 is disposed on the substrate stage 4 based on the positions of the reference marks 401 and 401' that are measured in step S2.

For example, at the time of moving the substrate 310 to the substrate stage 4 using the conveyance hand 60, the position of the substrate stage 4 in the X- and Y-directions and the rotation angle about the Z-axis are corrected based on the position and rotation angle stored in the memory in step S3, with the conveyance hand 60 holding the substrate 310. Alternatively, in a case in which the conveyance hand 60 is a conveyance hand having a degree of freedom of three or more axes, the position of the conveyance hand 60 in the position control system can be corrected based on the positions and rotation angle stored in the memory in step S3.

Alternatively, after the position of the center of the substrate 310 is determined by the PA detector 50, the position of the substrate 310 in the X- and Y-directions and the rotation angle about the Z-axis are changed on the stage 53 of the PA detector 50 based on the positions and rotation angle stored in the memory in step S3. Then, the conveyance hand 60 can move the substrate 310 from the PA detector 50 to the substrate stage 4. Alternatively, the position and angle of the chuck 400 (detection fields of the optical systems 160 and 160') on the substrate stage 4 can be adjusted. Alternatively, the foregoing correction methods can be combined.

The amount of correction of the rotation angle about the Z-axis is desirably reduced as much as possible from the angle adjusted by the PA detector 50 according to the coordinate system of the substrate stage 4. The reason is as follows. In a case in which the rotation angle about the Z-axis is corrected according to the coordinate system of the substrate stage and exposure is conducted, if the rotation angle of the substrate 310 exceeds the angle driving range of the substrate stage 4, an operation of correcting the rotation of the substrate 310 becomes necessary.

Specifically, the substrate 310 is held with a pin to rotate the substrate stage 4 alone, and the rotation of the substrate 310 is corrected. Consequently, the throughput decreases. Thus, the amount of correction of the rotation angle about the Z-axis is desirably as small as possible in the case of disposing the alignment mark 304 of the substrate 310 in the observation field 164 of the optical system 160.

The substrate stage 4 includes a chuck lifting/lowering mechanism (not illustrated) and a suction pin that protrudes when the chuck 400 is lowered. Before the substrate 310 is passed onto the substrate stage 4, the chuck 400 is lowered by the lifting/lowering mechanism and the suction pin protrudes. The conveyance hand 60 is lowered in the Z-direction, and before the substrate 310 comes into contact with the suction pin, the suction of the conveyance hand 60 is weakened. Further, the conveyance hand 60 is lowered, and the substrate 310 is suctioned with the suction pin, and the substrate 310 is passed. Thereafter, the conveyance hand 60 is moved backward in the horizontal direction and away from the substrate stage 4. After the movement of the conveyance hand 60 is confirmed, the chuck lifting/lowering mechanism of the substrate stage 4 lifts and drives the chuck 400. The suction of the suction pin is weakened before the substrate 310 comes into contact with the chuck suction mechanism. Further, the chuck 400 is lifted and suctions the substrate 310, whereby the substrate 310 has been passed to the chuck 400.

In this way, the alignment marks 304 and 304' of the substrate 310 that are detected from the suction surface side of the substrate 310 by the optical systems 160 and 160' are brought into the detection fields of the optical systems 160 and 160', and thus an alignment mark detection error is reduced. Further, it becomes unnecessary to place the substrate 310 again, replace the chuck 400, or place the chuck 400 again due to a detection error, and thus the throughput improves.

Next, in step S5, the alignment marks 304 and 304' of the substrate 310 in the detection fields of the optical systems 160 and 160' are detected. The position of the substrate 310 in the X- and Y-directions and the rotation angle about the Z-axis (orientation) are determined based on the detected positions of the alignment marks 304 and 304'.

Figure 12:
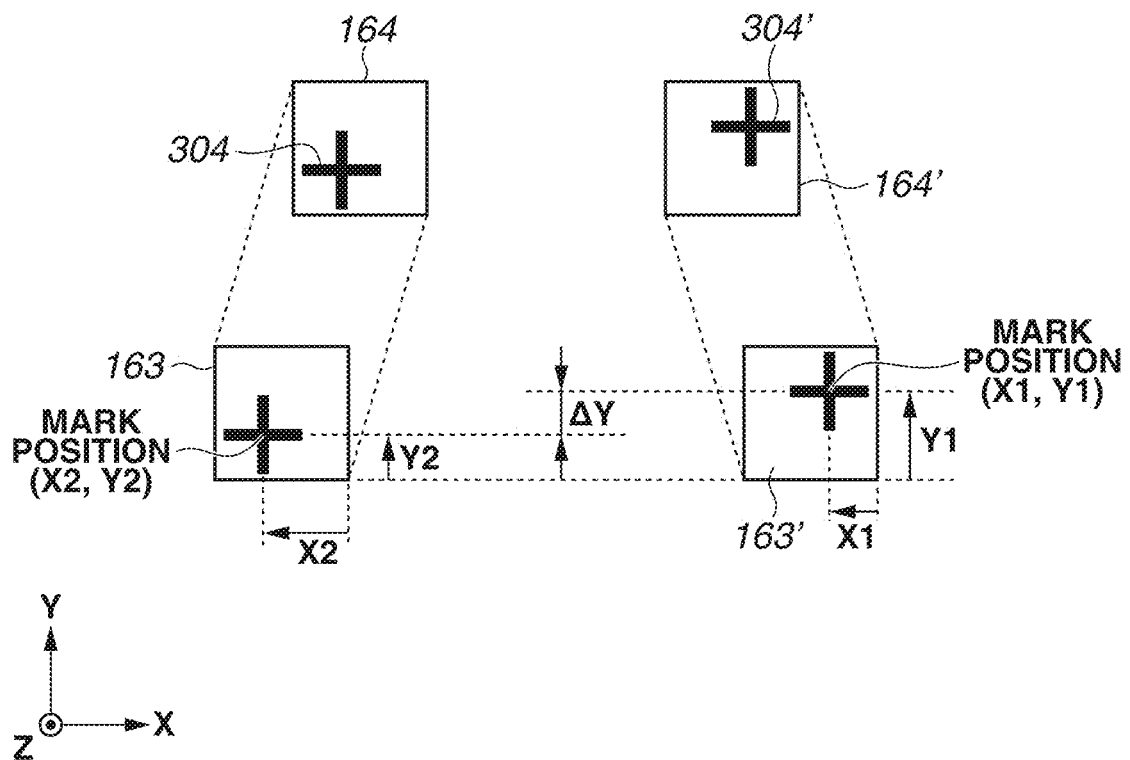
FIG. 12 is a diagram illustrating how an alignment mark is detected.

The following describes a method of detecting the alignment marks 304 and 304' with reference to FIG. 12. The positions of the alignment marks 304 and 304' are measured using the optical systems 160 and 160' and the substrate alignment detection system 16. The positions of the alignment marks 304 and 304' measured and acquired based on the position of the photoelectric conversion element 34 of the substrate alignment detection system 16 are denoted (X1, Y1) and (X2, Y2), respectively. The rotation angle θ of the substrate about the Z-axis is calculated by dividing Y2−Y1=ΔY by the distance between the observation fields of the optical systems 160 and 160'.

In the correction of the rotation angle of the substrate 310 about the Z-axis, the amount of correction of the rotation angle θ with respect to the actual run of the substrate stage 4 needs to be calculated by subtracting a rotation deviation θc of the chuck 400 based on the reference marks from the calculated rotation angle θ in the coordinate system of the substrate stage 4. FIG. 12 is a diagram illustrating a case in which there is no rotation deviation θc of the chuck 400 based on the reference marks. In a case in which there is a rotation deviation θc of the chuck 400 based on the reference marks, the positions of the observation fields 164 and 164' are deviated, and the image planes 163 and 163' are also deviated.

Next, in step S6, the substrate 310 is aligned based on the position and orientation of the substrate 310 obtained in step S5 and the positions of the observation fields (chuck) of the optical systems 160 and 160' obtained from the positions of the reference marks measured in step S2. Specifically, the substrate 310 is aligned with the projection optical system 6 (coordinate system of the substrate stage 4) with respect to the position of the substrate 310 in the X- and Y-directions and the rotation angle about the Z-axis.

If the substrate alignment is completed as a result of the foregoing step, then in step S7, the shutter unit 165 is changed to the light-shielding state. In this way, the amount of exposure light that enters the optical system 160 is reduced to prevent a change in optical characteristics of the optical members of the optical system 160.

Then, in step S8, the exposure apparatus 100 projects an image of the pattern of the mask 1 onto the front surface side of the substrate 310, i.e., the photoresist applied to the wafer 301, to form a latent image pattern on the photoresist. Since the pattern is formed on the substrate 310 after the substrate 310 has been aligned, the overlay precision of the patterns on the front and rear surface sides of the substrate 310 is improved.

Shutter Unit in First Modified Example

Figure 13:
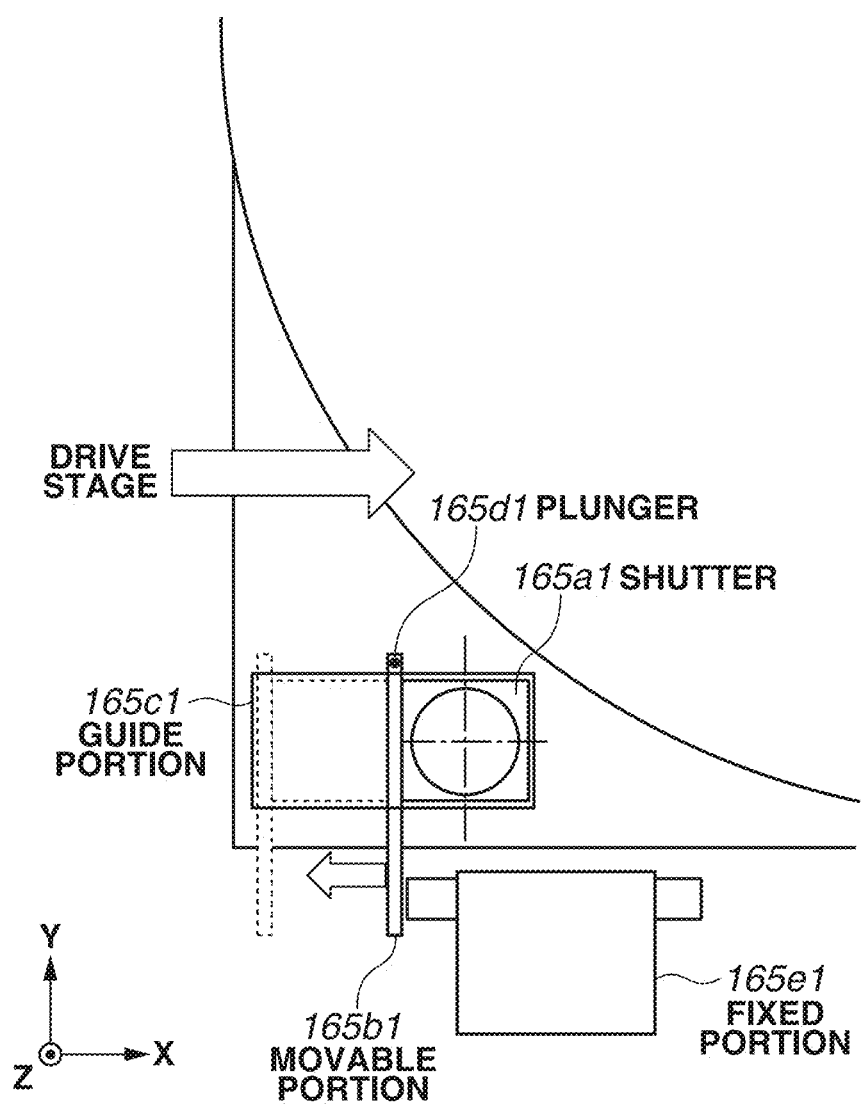
FIG. 13 is a diagram illustrating a shutter unit in a first modified example in accordance with the present invention.

The shutter unit 165 can be configured as illustrated in FIG. 13. The shutter unit 165 includes the shutter 165a1, the movable portion 165b1 connected to the shutter 165a1, and a guide portion 165c1 configured to guide the movement of the movable portion 165b1. Further, the shutter unit 165 includes a plunger 165d1 and a fixed portion 165e1. The plunger 165d1 is a lock member configured to restrict the movement of the movable portion 165b1. The fixed portion 165e1 is provided separately from the substrate stage 4.

The movable portion 165b1 is configured to move simultaneously with movement of the substrate stage 4, and the movable portion 165b1 is movable along the guide portion 165c1 in the X-axis direction specified in FIG. 13. The light transmission state of the shutter unit 165 is changed between the light-shielding state specified by a solid line in FIG. 13 and the light-transmitting state specified by a broken line in FIG. 13. The plunger 165*d*1 is disposed in a depressed portion of the chuck 400 and has the function of fixing the shutter 165*a*1 at the position in the light-shielding state and the position in the light-transmitting state.

The fixed portion 165*e*1 is provided in the movement direction of the movable portion 165*b*1, and if the substrate stage 4 is further driven in the state in which the movable portion 165*b*1 and the fixed portion 165*e*1 are in contact with each other, a force not less than a predetermined level is applied to the plunger 165*d*1. Consequently, the locked state of the plunger 165*d*1 is cancelled, and the movable portion 165*b*1 is moved. At the position at which the shutter 165*a*1 is changed to the light-shielding state, the plunger 165*d*1 is changed to the lock state again.

The shutter unit 165 is configured as described above so that the light transmission state of the shutter unit 165 is changeable without providing an actuator such as a motor. In this way, the risks that the alignment accuracy or pattern forming accuracy is decreased due to heat generation by an actuator are reduced.

Shutter Unit in Second Modified Example

Figure 14:
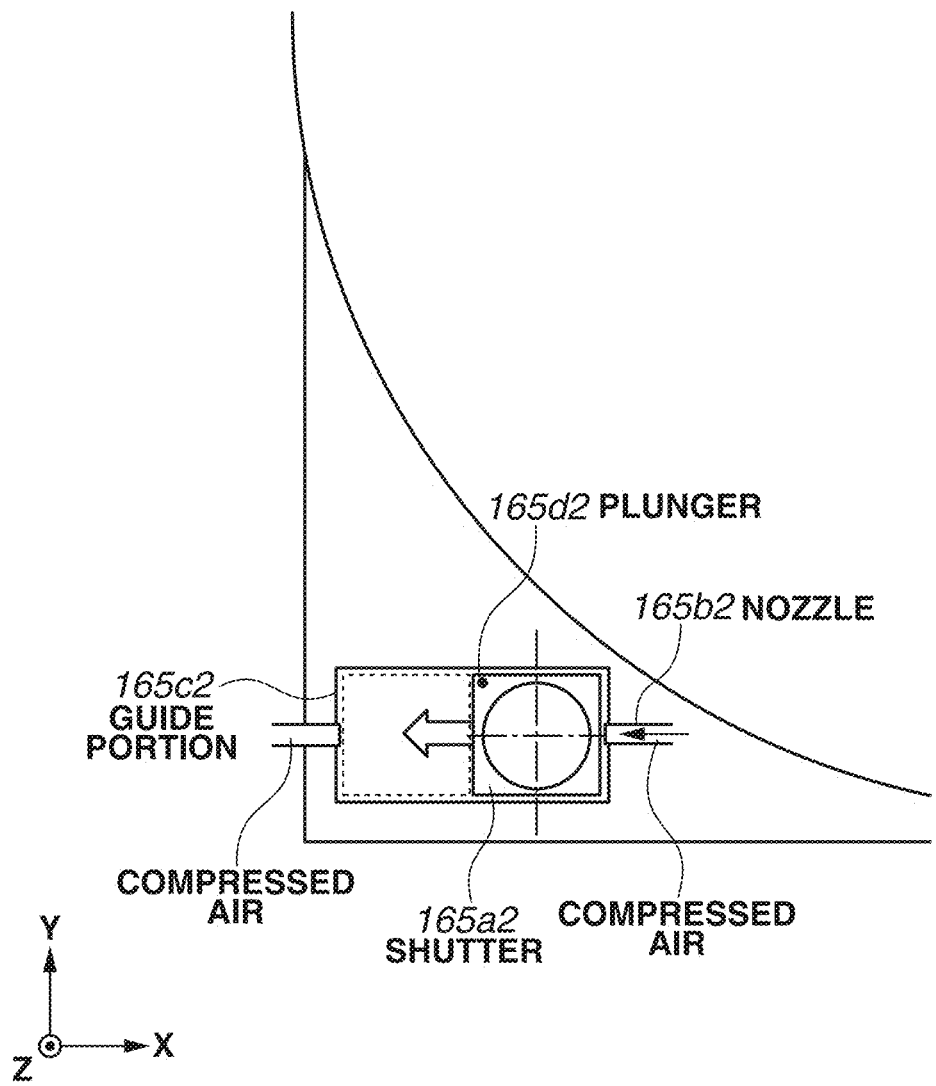
FIG. 14 is a diagram illustrating a shutter unit in a second modified example In accordance with the present invention.

The shutter unit 165 can be configured as illustrated in FIG. 14. The shutter unit 165 includes the shutter 165*a*2, a nozzle 165*b*2, and the guide portion 165*c*2. The nozzle 165*b*2 supplies (passes) air to the shutter 165*a*2. The guide portion 165*c*2 guide the movement of the shutter 165*a*2. Further, the shutter unit 165 includes the plunger 165*d*2 as the lock member for restricting the movement of the shutter 165*a*2.

The nozzle 165*b*2 is provided with a valve for changing the air supply direction, and the direction in which air is passed is changeable by switching the valve. The plunger 165*d*2 has a similar function to the function described above in the first modified example.

Further, in a case in which the shutter 165*a*2 is a magnetic member, the shutter 165*a*2 can be driving by disposing an electromagnet and passing electricity through the electromagnet.

Shutter Unit in Third Modified Example

Figure 15:
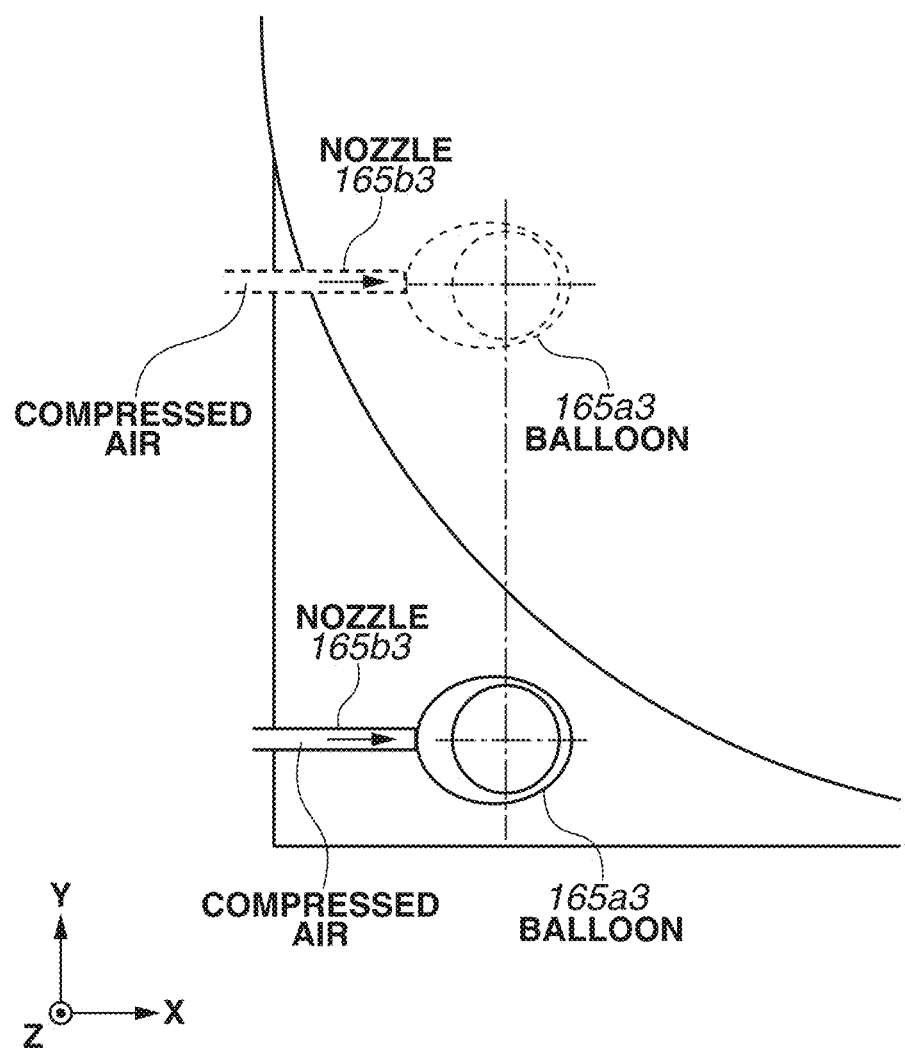
FIG. 15 is a diagram illustrating a shutter unit in a third modified example in accordance with the present invention.

The shutter unit 165 can be configured as illustrated in FIG. 15. The shutter unit 165 includes a balloon 165*a*3 as a shutter member and the nozzle 165*b*3 configured to supply air to the balloon 165*a*3. The shutter unit 165 is changed to the light-shielding state by supplying air to the balloon 165*a*3 to expand the balloon 165*a*3. The shutter unit 165 is changed to the light-transmitting state by reducing the amount of air supplied to the balloon 165*a*3 to shrink the balloon 165*a*3.

The configurations in the modified examples realize a simplified configuration of the shutter unit 165. It is thus possible to provide the shutter unit 165 below the substrate alignment detection system 16 and also below the alignment mark 304, as illustrated by the solid and broken lines in FIG. 15. Thus, even in a case in which, for example, exposure light accidentally enters from the alignment mark 304 side in the state in which no substrate 310 is held on the chuck 400, the exposure light is prevented from entering the optical system 160 by maintaining the balloon 165*a*3 in the expanded state.

Other Modified Example

The substrate is not limited to the substrate 310, and the alignment marks 304 and 304' may be formed on the front surface opposite to the rear surface of the substrate, i.e., the suction surface 312 of the substrate 310 which is suctioned by the chuck 400. In this case, since the light to illuminate the alignment marks 304 and 304' by the optical system 160 does not have to transmit through the substrate such as a silicon substrate, the light does not have to have an infrared wavelength.

Further, it is desirable that the materials used in the optical members of the optical system 160 are strongly resistant to the exposure light. As used herein, the phrase "materials that are strongly resistant to the exposure light" refers to materials whose optical characteristics are not likely to change when the exposure light is applied to the materials.

As described above, the materials of the optical members of the optical system 160 are devised as described above to reduce a change in optical characteristics of the optical system 160 even in the case in which the exposure light enters the optical system 160.

Further, it is also possible to effectively avoid the situation that the exposure light enters the optical system 160, by devising the arrangement of the optical system 160. A possible solution is to set the distance between the mirror 161 and the edge portion of the substrate 310 in FIG. 5 to a relatively long distance. Further, setting a recipe for pattern forming to prevent light for pattern forming from illuminating above the mirror 161 is also effective.

Further, the apparatus to which the chuck 400 is applied is not limited to an exposure apparatus, and the chuck 400 is applicable to a lithography apparatus such as a drawing apparatus and an imprint apparatus. The drawing apparatus is a lithography apparatus that draws on a substrate with a charged particle beam (electron beam, ion beam, etc.), and the imprint apparatus is a lithography apparatus that molds an imprint material (resin, etc.) on a substrate and forms a pattern on the substrate. Further, the substrate is not limited to a Si wafer and can be a silicon carbide (SiC) substrate, sapphire substrate, dopant Si substrate, glass substrate, etc.

Article Manufacturing Method

Next, the following describes a method of manufacturing an article (semiconductor IC element, liquid crystal display device, etc.) using the above-described lithography apparatus. The method of manufacturing an article includes forming a pattern on a substrate (wafer, glass plate, film-shaped substrate, etc.) using the above-described lithography apparatus and processing (developing, etching, etc.) the substrate on which the pattern is formed. The method of manufacturing an article is more advantageous than a conventional method in at least one of the performance, quality, and productivity of the article. Further, the above-described lithography apparatus is capable of providing an economical, high-quality article such as a device (semiconductor integrated circuit element, liquid crystal display device, etc.) with a high throughput.

While various exemplary embodiments of the present invention have been described above, it should be noted that the scope of the invention is not limited to the disclosed exemplary embodiments.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-035313, filed Feb. 28, 2018, which is hereby incorporated by reference herein in its entirety.

What is claimed is:

1. A pattern forming apparatus configured to form a pattern on a substrate, the pattern forming apparatus comprising:
   a first optical system configured to emit first light on the substrate for forming the pattern on the substrate;
   a holding portion configured to hold the substrate by suction;
   a detection unit configured to emit second light for detecting, via a second optical system from a suction surface side of the substrate, an alignment mark provided to the substrate held by the holding portion; and
   a unit configured to shield the first light incident to the second optical system while the first optical system emits the first light and transmits the second light incident to the second optical system while the detection unit emits the second light
   wherein the first optical system and the detection unit are disposed apart from each other in a direction perpendicular to the optical axis of the first optical system, and the unit shields the first light emitted from the first optical system and transmit the second light emitted from the detection unit.

2. The pattern forming apparatus according to claim 1, wherein the unit is a shutter unit configured to selectively shield the light entering the second optical system.

3. The pattern forming apparatus according to claim 2, wherein a light transmission state of the shutter unit is changed to one of a light-shielding state in which the first light incident to the second optical system is shielded and a light-transmitting state in which the second light incident to the second optical system is transmitted.

4. The pattern forming apparatus according to claim 3, wherein while the first light for forming the pattern on the substrate is applied, the shutter unit is in the light-shielding state.

5. The pattern forming apparatus according to claim 3,
   wherein the shutter unit includes a movable shutter member, and
   wherein the light transmission state of the shutter unit is changed between the light-shielding state and the light-transmitting state by moving the shutter member.

6. The pattern forming apparatus according to claim 5, further comprising a nozzle configured to supply air for moving the shutter member.

7. The pattern forming apparatus according to claim 5,
   wherein the shutter unit further includes an electromagnet, and
   wherein the shutter member which is a magnetic member is moved by passing electricity through the electromagnet.

8. The pattern forming apparatus according to claim 5, further comprising:
   a balloon configured to move the shutter member; and
   a nozzle configured to supply air to the balloon,
   wherein the shutter member is moved by controlling an amount of air supplied to the balloon.

9. The pattern forming apparatus according to claim 1, wherein the detection unit acquires a position of the alignment mark by detecting an image of the alignment mark which is formed on an image plane.

10. The pattern forming apparatus according to claim 1, wherein a position of the second optical system with respect to the holding portion is fixed.

11. The pattern forming apparatus according to claim 1, further comprising a stage that is movable,
    wherein the holding portion is removable from the stage.

12. The pattern forming apparatus according to claim 11, wherein the unit is provided on the stage.

13. The pattern forming apparatus according to claim 11,
    wherein the unit includes a movable shutter member and a movable portion connected to the movable shutter member, and
    wherein the movable portion is moved with movement of the stage.

14. The pattern forming apparatus according to claim 13,
    wherein the movable portion is provided with a plunger, and
    wherein the movable portion becomes movable by cancellation of a lock state of the plunger.

15. The pattern forming apparatus according to claim 1, wherein the second optical system is provided and fixed in the holding portion.

16. The pattern forming apparatus according to claim 15, wherein the second optical system is a relay optical system provided and fixed in the holding portion.

17. The pattern forming apparatus according to claim 1, wherein the unit is further configured to switch from a light-transmitting state for detecting the alignment mark to a light-shielding state in a case where an image of the pattern is projected on the substrate.

18. The pattern forming apparatus according to claim 1, wherein the unit is disposed on a surface of the holding portion coplanar with the suction surface side.

19. The pattern forming apparatus according to claim 1, wherein the second optical system is provided in the holding portion and the unit is disposed inside of the second optical system.

20. The pattern forming apparatus according to claim 1, wherein the first optical system is configured to project the image of the pattern on the substrate.

21. The pattern forming apparatus according to claim 1, wherein the detection unit includes an objective lens through which the second light passes and an optical axis of the objective lens is parallel to an optical axis of the first optical system.

22. The pattern forming apparatus according to claim 1, wherein the detecting unit is disposed at a predetermined distance apart from the first optical system in a direction perpendicular to the optical axis of the first optical system.

23. A method of detecting an alignment mark in a pattern forming apparatus that includes a first optical system configured to emit first light on the substrate for forming the pattern on the substrate, a holding portion configured to hold a substrate by suction, a detection unit configured to emit second light for detecting, via a second optical system from a suction surface side of the substrate, an alignment mark provided to the substrate held by the holding portion, and a unit configured to shield and transmit light incident to the second optical system, the method comprising:
    controlling a light transmission state of the unit in such a manner that the first light incident to the second optical system is shielded while the first optical system emits the first light and the second light incident to the second optical system is transmitted while the detection unit emits the second light; and
    detecting, via the second optical system, an image of the alignment mark which is formed on an image plane.

24. A method of forming a pattern in a pattern forming apparatus that includes a first optical system configured to emit first light one the substrate for forming the pattern on the substrate, a holding portion configured to hold a substrate by suction, a detection unit configured to emit second light for detecting, via a second optical system from a suction surface side of the substrate, an alignment mark provided to the substrate held by the holding portion, and a unit configured to shield and transmit light incident to the second optical system, the method comprising:

controlling a light transmission state of the unit in such a manner that the first light incident to the second optical system is shielded while the first optical system emits the first light and the second light incident to the second optical system is transmitted while the detection unit emits the second light; and forming a pattern on the substrate by applying the first light toward the substrate.

25. A method of manufacturing an article, the method comprising:

forming a pattern on a substrate using a pattern forming apparatus configured to form the pattern on the substrate; and manufacturing an article by processing the substrate on which the pattern is formed, wherein the pattern forming apparatus includes:

a first optical system configured to emit first light on the substrate for forming the pattern on the substrate;

a holding portion configured to hold the substrate by suction;

a detection unit configured to emit second light for detecting, via a second optical system from a suction surface side of the substrate, an alignment mark provided to the substrate held by the holding portion; and a unit configured to shield the first light incident to the second optical system while the first optical system emits the first light and transmit the second light incident to the second optical system while detection unit emits the second light.

* * * * *